United States Patent
Lee

(12) United States Patent (10) Patent No.: US 7,459,942 B2
Lee (45) Date of Patent: Dec. 2, 2008

(54) SAMPLED-DATA CIRCUITS USING ZERO CROSSING DETECTION

(75) Inventor: Hae-Seung Lee, Bedford, MA (US)

(73) Assignee: Cambridge Analog Technologies, Inc., Bedford, MA (US)

( * ) Notice: Subject to any disclaimer, the term of this patent is extended or adjusted under 35 U.S.C. 154(b) by 109 days.

(21) Appl. No.: 11/454,435

(22) Filed: Jun. 16, 2006

(65) Prior Publication Data

US 2007/0001518 A1 Jan. 4, 2007

Related U.S. Application Data

(60) Provisional application No. 60/595,493, filed on Jul. 11, 2005, provisional application No. 60/595,414, filed on Jul. 1, 2005.

(51) Int. Cl.
*H03K 5/22* (2006.01)

(52) U.S. Cl. ............................. 327/78; 327/79; 327/94

(58) Field of Classification Search .................... 327/78, 327/79, 94
See application file for complete search history.

(56) References Cited

U.S. PATENT DOCUMENTS

| 4,584,532 | A | * | 4/1986  | Duehren et al. | 327/554 |
| 4,682,102 | A | * | 7/1987  | Milkovic       | 324/142 |
| 4,800,333 | A | * | 1/1989  | Milkovic       | 324/142 |
| 5,121,061 | A | * | 6/1992  | Schwab         | 324/453 |
| 5,142,236 | A | * | 8/1992  | Maloberti et al. | 327/337 |
| 5,159,341 | A | * | 10/1992 | McCartney et al. | 341/143 |
| 6,469,561 | B2 | * | 10/2002 | Pernigotti et al. | 327/336 |

FOREIGN PATENT DOCUMENTS

| EP | 1221686 A2 | 7/2002 |
| GB | 2114841 A  | 8/1983 |
| GB | 2247120 A  | 2/1992 |

* cited by examiner

*Primary Examiner*—Kenneth B. Wells
(74) *Attorney, Agent, or Firm*—Gauthier & Connors LLP

(57) ABSTRACT

A sampled-data analog circuit includes a level-crossing detector. The level-crossing detector controls sampling switches to provide a precise sample of the output voltage when the level-crossing detector senses the predetermined level crossing of the input signal. The level-crossing detection may be a zero-crossing detection. An optional common-mode feedback circuit can keep the output common-mode voltage substantially constant.

15 Claims, 22 Drawing Sheets

SAMPLED-DATA CIRCUITS USING ZERO CROSSING DETECTION

PRIORITY INFORMATION

The present application claims priority, under 35 U.S.C. §119(e), from U.S. Provisional Patent Application Ser. No. 60/595,414, filed on Jul. 1, 2005. Also, the present application claims priority, under 35 U.S.C. §119(e), from U.S. Provisional Patent Application Ser. No. 60/595,493, filed on Jul. 11, 2005. The entire contents of U.S. Provisional Patent Application Ser. No. 60/595,414, filed on Jul. 1, 2005, and U.S. Provisional Patent Application Ser. No. 60/595,493, filed on Jul. 1, 2005, are hereby incorporated by reference.

FIELD OF THE PRESENT INVENTION

The present invention relates generally to a switched capacitor circuit and, more particularly, to a switched capacitor circuit for integrated circuits manufactured according to scaled semiconductor processes.

BACKGROUND OF THE PRESENT INVENTION

Most sampled-data analog circuits such as switched-capacitor filters, analog-to-digital converters, and delta-sigma modulators require operational amplifiers to process a signal. Consider the switched-capacitor integrator example shown in FIG. 2. First, the switches $S_{11}$ and $S_{13}$ are closed so that the input voltage $v_{in}$ is sampled on the sampling capacitor $C_{S1}$. Next, the switches $S_{11}$ and $S_{13}$ are opened and $S_{12}$ and $S_{14}$ are closed. This operation transfers the charge in the sampling capacitor $C_{S1}$ to the integrating capacitor $C_{I1}$. The output voltage, $v_{out}$, of a first integrator 1100 is typically sampled by another sampled-data circuit, for example, another switched-capacitor integrator. In the circuit shown in FIG. 2, the circuit consisting of switches $S_{21}$, $S_{22}$, $S_{23}$, $S_{24}$, and a second sampling capacitor $C_{S2}$ comprise a part of the second switched-capacitor integrator. The output voltage, $v_{out}$, of the first integrator 1100 is sampled by the second sampling capacitor $C_{S2}$ by closing switches $S_{21}$ and $S_{23}$.

An example of a timing diagram is shown in FIG. 3. The clock signal has two non-overlapping phases $\phi_1$ and $\phi_2$. The phase $\phi_1$ is applied to switches $S_{11}$, $S_{13}$, $S_{21}$, and $S_{23}$, and phase $\phi_2$ is applied to switches $S_{12}$, $S_{14}$, $S_{22}$, and $S_{24}$. With this timing, the circuit performs non-inverting discrete integration with full clock delay. The waveforms at the output of the integrator, $v_{out}$, and at the virtual ground node 100, $v_1$, are also shown in FIG. 3. Different clock phasing arrangements yield different responses from the integrator. For example, if $\phi_1$ is applied to switches $S_{11}$, $S_{13}$, $S_{22}$, and $S_{24}$, and phase $\phi_1$ is applied to switches $S_{12}$, $S_{14}$, $S_{21}$, and $S_{23}$, the circuit performs non-inverting integration with half-clock delay.

For an accurate integration of the input signal, $v_1$ must be driven as close to ground as possible. In order to accomplish this, the operational amplifier must provide sufficient open-loop gain and low noise. In addition, for fast operation, the operational amplifier 10 of FIG. 2 must settle fast.

In FIG. 3, the voltage $v_1$ is shown to settle back to ground after a disturbance when the sampling capacitor $C_{S1}$ is switched to Node 100 by closing $S_{12}$ and $S_{14}$. In addition to high open-loop gain and fast settling time, operational amplifiers must provide large output swing for high dynamic range. As the technology scales, it becomes increasingly difficult to achieve these characteristics from operational amplifiers. The primary factors that make the operational amplifier design difficult are low power supply voltages and low device gain.

As noted above, accurate output voltage can be obtained if Node 100 in FIG. 2 is maintained precisely at ground. However, in sampled-data circuits, the only point of time that an accurate output voltage is required is at the instant the output voltage is sampled by another sampling circuit. Thus, it is not necessary to maintain the voltage at Node 100 at ground all the time.

Therefore, it is desirable to provide a sampled-data circuit that maintains the proper level at the virtual ground node at the instant the output voltage is sampled by another sampling circuit. Moreover, it is desirable to provide a sampled-data circuit that maintains the proper level at the virtual ground node at the instant the output voltage is sampled by another sampling circuit and provides differential signal paths for sampled-data circuits. Furthermore, it is desirable to provide a sampled-data circuit that reduces the effect of power supply, substrate, and common-mode noise by symmetric differential signal processing. Also, it is desirable to provide a sampled-data circuit that increases the signal range by incorporating differential signal paths.

SUMMARY OF THE PRESENT INVENTION

One aspect of the present invention is a switched-capacitor circuit. The switched-capacitor circuit includes a level-crossing detector to generate a level-crossing detection signal when an input signal crosses a predetermined level; a plurality of capacitors; and a sampling switch, operatively coupled to the level-crossing detector. The sampling switch turns OFF when the level-crossing detection signal indicates a level-crossing.

Another aspect of the present invention is a switched-capacitor circuit. The switched-capacitor circuit includes a level-crossing detector to generate a level-crossing detection signal when an input signal crosses a first predetermined level; a second level-crossing detector to generate a second level-crossing detection signal when the input signal crosses a second predetermined level; a plurality of capacitors; and a sampling switch, operatively coupled to the second level-crossing detector. The sampling switch turns OFF when the second level-crossing detection signal indicates the input signal crosses the second predetermined level.

Another aspect of the present invention is a switched-capacitor circuit. The switched-capacitor circuit includes a first switched capacitance network having an input terminal to receive a circuit input voltage; a level-crossing detector, having an output terminal and an input terminal, to generate a level-crossing detection signal when a signal at the input terminal crosses a predetermined level; and a second switched capacitance network operatively coupled to the level-crossing detector. The second switched capacitance network turns OFF when the difference between the first and second input signals crosses the predetermined level.

Another aspect of the present invention is a method for sampling an analog signal. The method samples an input voltage using the switched capacitance network; determines when a node voltage of the switched capacitance network crosses a predetermined level; and provides a sample of an output voltage of the switched capacitance network when it is determined that the node voltage of the switched capacitance network crosses the predetermined level.

Another aspect of the present invention is a method for sampling an analog signal. The method samples an input voltage using the switched capacitance network; determines when a node voltage of the switched capacitance network crosses a first predetermined level; determines when the node voltage of the switched capacitance network crosses a second predetermined level; and provides a sample of an output voltage of the switched capacitance network when it is determined that the node voltage of the switched capacitance network crosses the second predetermined level.

Another aspect of the present invention is a differential switched-capacitor circuit. The differential switched-capacitor circuit includes a level-crossing detector to generate a level-crossing detection signal when a difference between first and second input signals crosses a predetermined level; a plurality of capacitors; and a sampling switch, operatively coupled to the level-crossing detector. The sampling switch turns OFF when the level-crossing detection signal indicates a level-crossing.

Another aspect of the present invention is a differential switched-capacitor circuit. The differential switched-capacitor circuit includes a level-crossing detector to generate a level-crossing detection signal when a difference between first and second input signals crosses a first predetermined level; a second level-crossing detector to generate a second level-crossing detection signal when a difference between first and second input signals crosses a second predetermined level; a plurality of capacitors; and a sampling switch, operatively coupled to the level-crossing detector. The sampling switch turns OFF when the second level-crossing detection signal indicates the difference between first and second input signals crosses the second predetermined level.

Another aspect of the present invention is a differential switched-capacitor circuit. The differential switched-capacitor circuit includes a first switched capacitance network having an input terminal to receive a first input voltage; a first switched capacitance network having an input terminal to receive a second input voltage; a level-crossing detector, having an output terminal and an input terminal, to generate a level-crossing detection signal when a difference between the first and second input signals crosses a predetermined level; and a third switched capacitance network operatively coupled to the level-crossing detector. The third switched capacitance network turns OFF when the difference between the first and second input signals crosses the predetermined level.

Another aspect of the present invention is a method for sampling an analog signal. The method samples input voltages; determines when a difference between first and second signals crosses a predetermined level; and provides output voltage samples when it is determined that the difference between the first and second signals crosses the predetermined level.

Another aspect of the present invention is a method for sampling an analog signal. The method samples input voltages; determines when a difference between first and second signals crosses a first predetermined level; determines when a difference between the first and second signals crosses a second predetermined level; and provides a sample of the output voltage when it is determined that the difference between the first and second signals crosses the second predetermined level.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
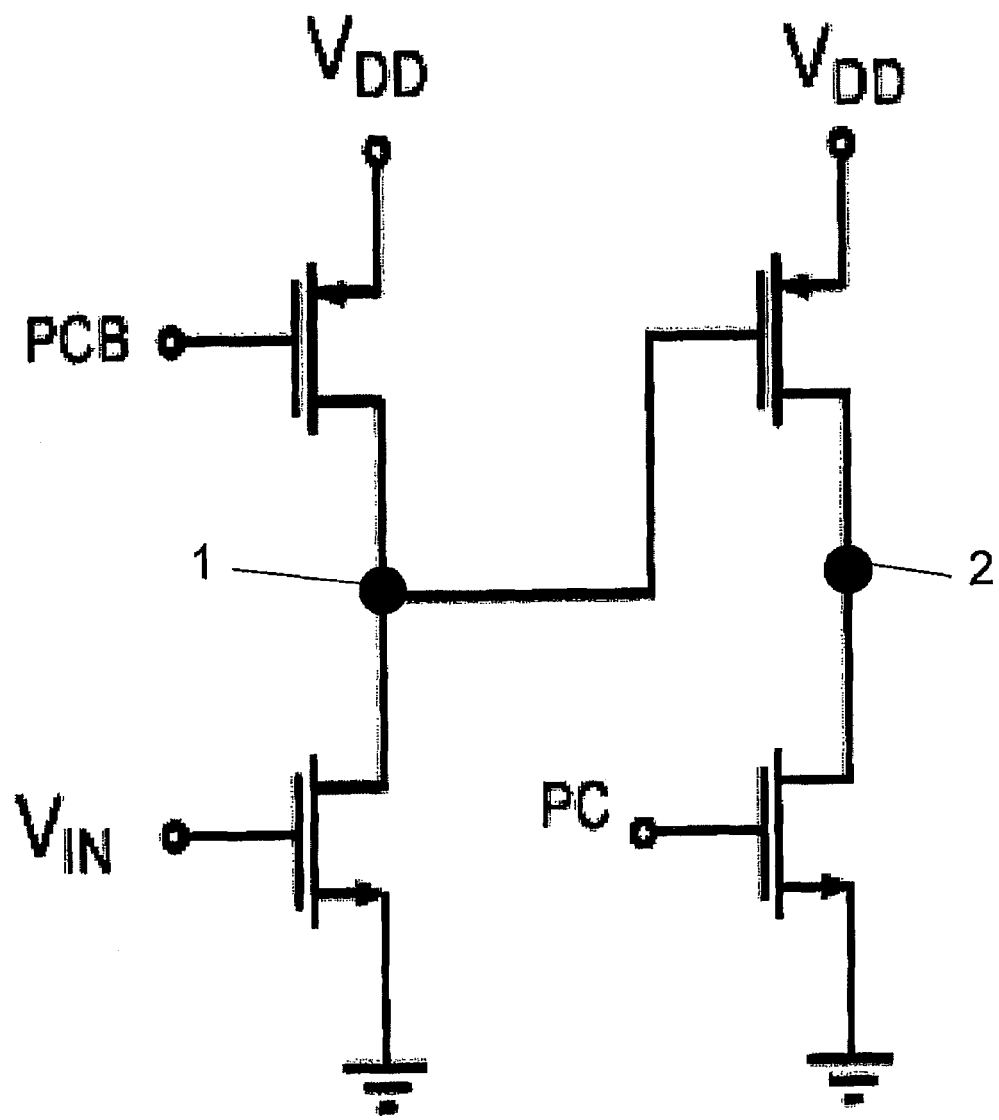
FIG. 1 illustrates a zero-crossing detector.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

It is noted that, in the various Figures, the earth symbol indicates the system's common-mode voltage. For example, in a system with 2.5 V and −2.5 V power supplies, the system's common-mode voltage may be at ground. In a system with a single 2.5 power supply, the system's common-mode voltage may be at 1.25 V.

Figure 2:
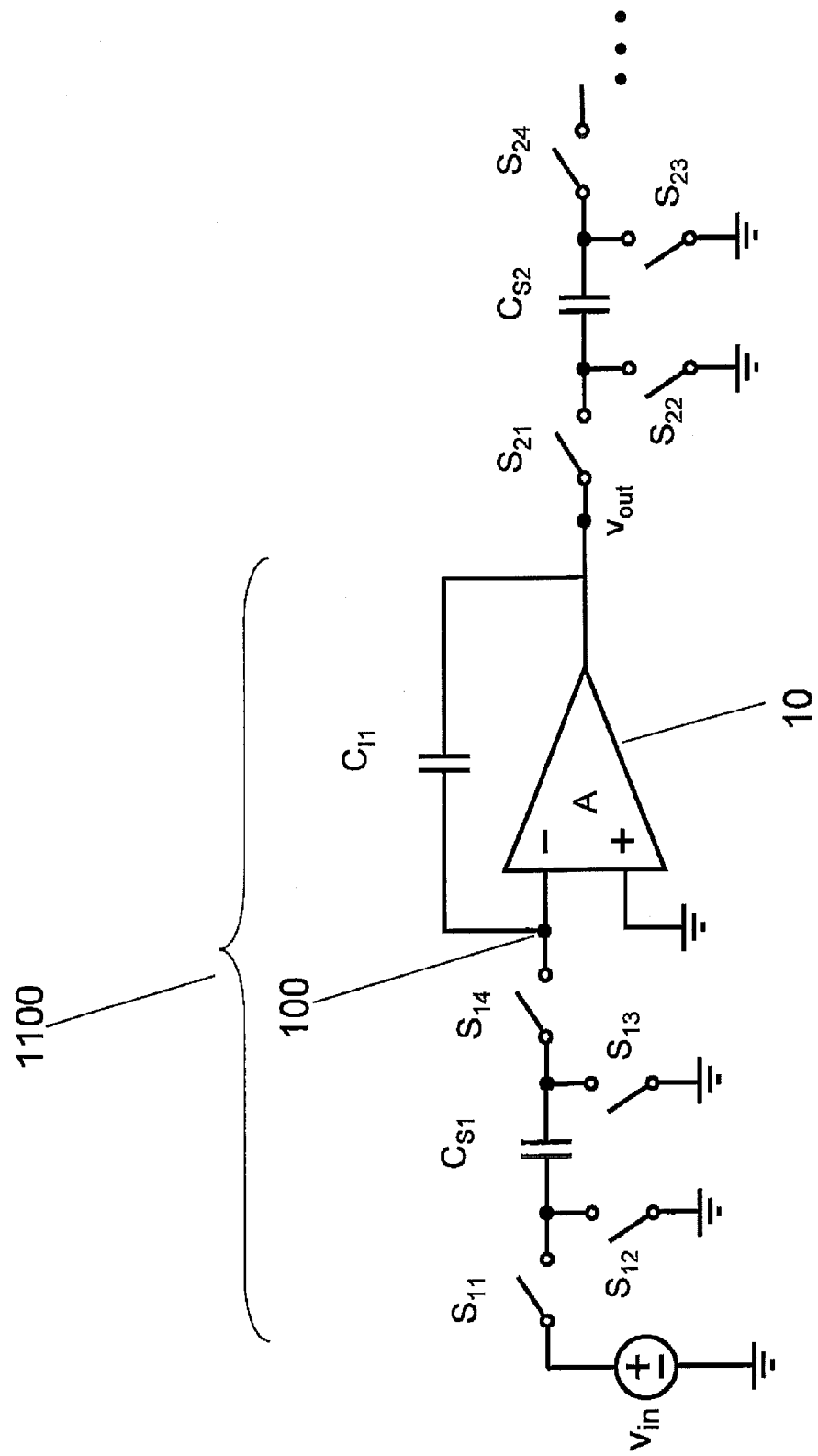
FIG. 2 illustrates a switched-capacitor integrator.
Figure 3:
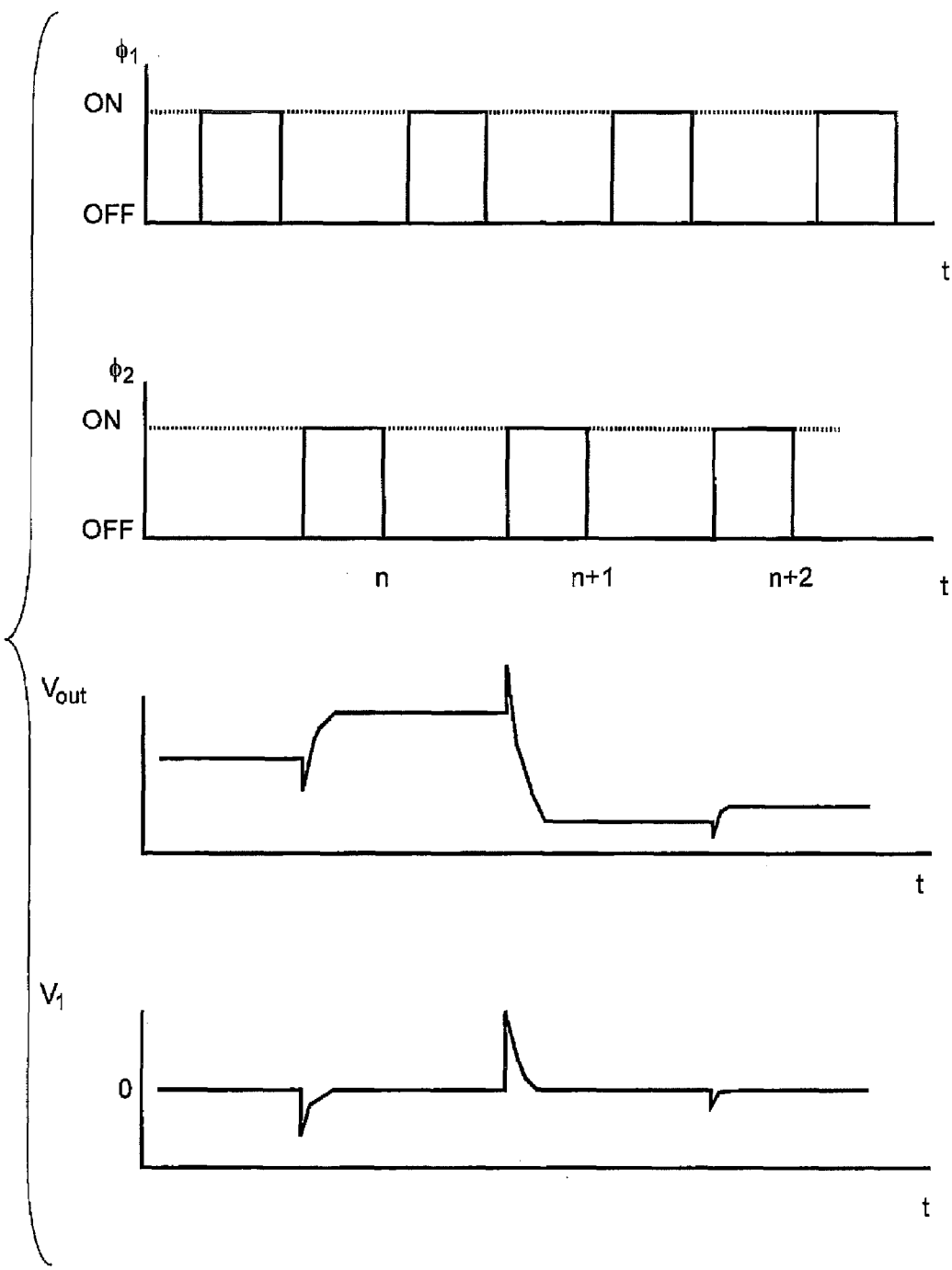
FIG. 3 illustrates a timing diagram for the switched-capacitor integrator of FIG. 2.

As noted above, accurate output voltage can be obtained if Node 100 in FIG. 2 is maintained precisely at ground. However, in sampled-data circuits, the only point of time accurate output voltage is required is at the instant the output voltage is sampled by another sampling circuit. Thus, it is not necessary to maintain the voltage at Node 100 at ground all the time.

Figure 4:
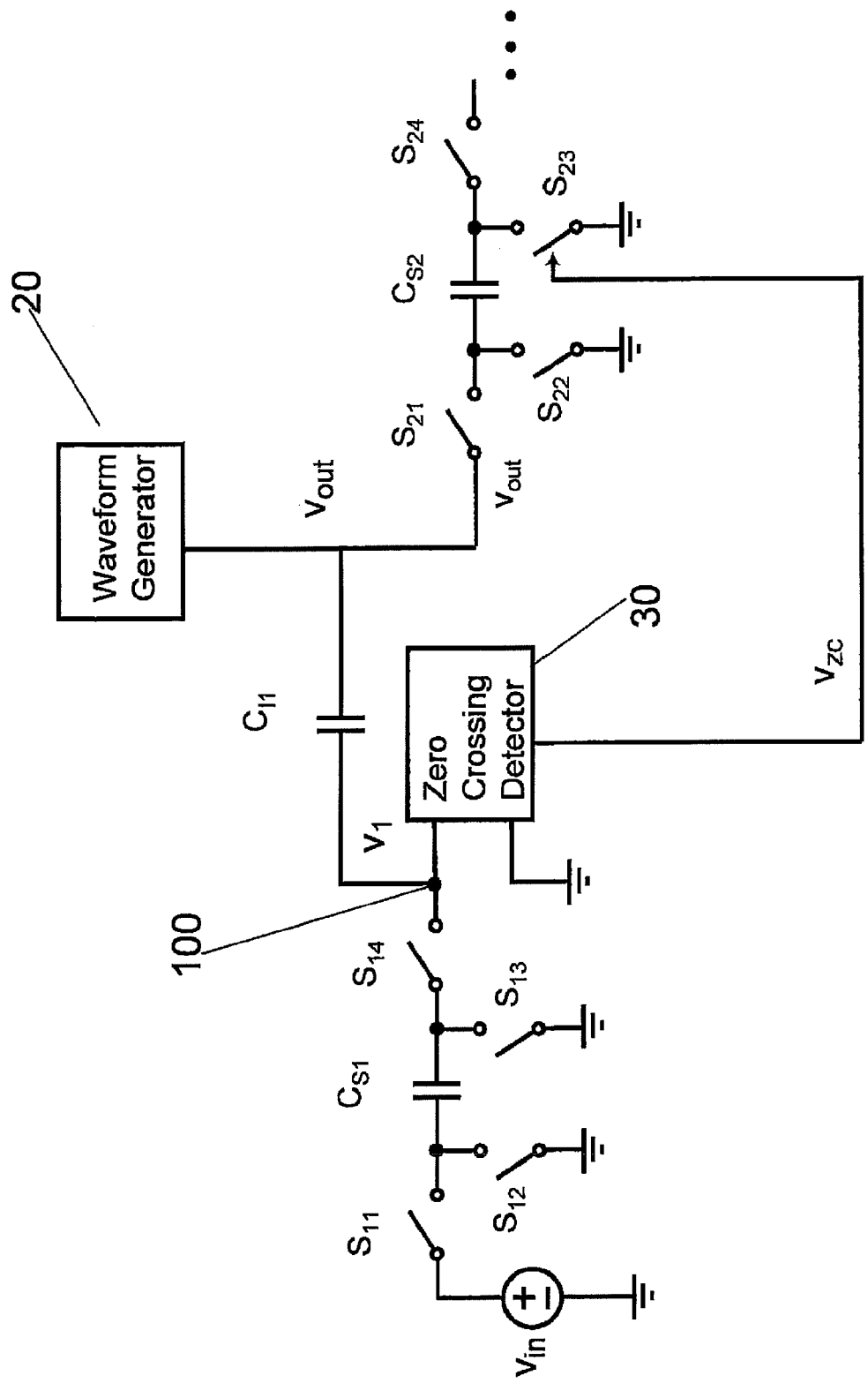
FIG. 4 illustrates a non-inverting integrator according to the concepts of the present invention.

FIG. 4 illustrates a non-inverting integrator according to the concepts of the present invention. More specifically, as an example, a non-inverting integrator with half-clock delay is illustrated in FIG. 4.

As illustrated in FIG. 4, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$. A waveform generator 20 generates a voltage waveform as the output voltage $v_{out}$ in such way the voltage at Node 100 crosses zero if the charge in capacitors $C_{S1}$ and $C_{I1}$ is within a normal operating range.

Figure 5:
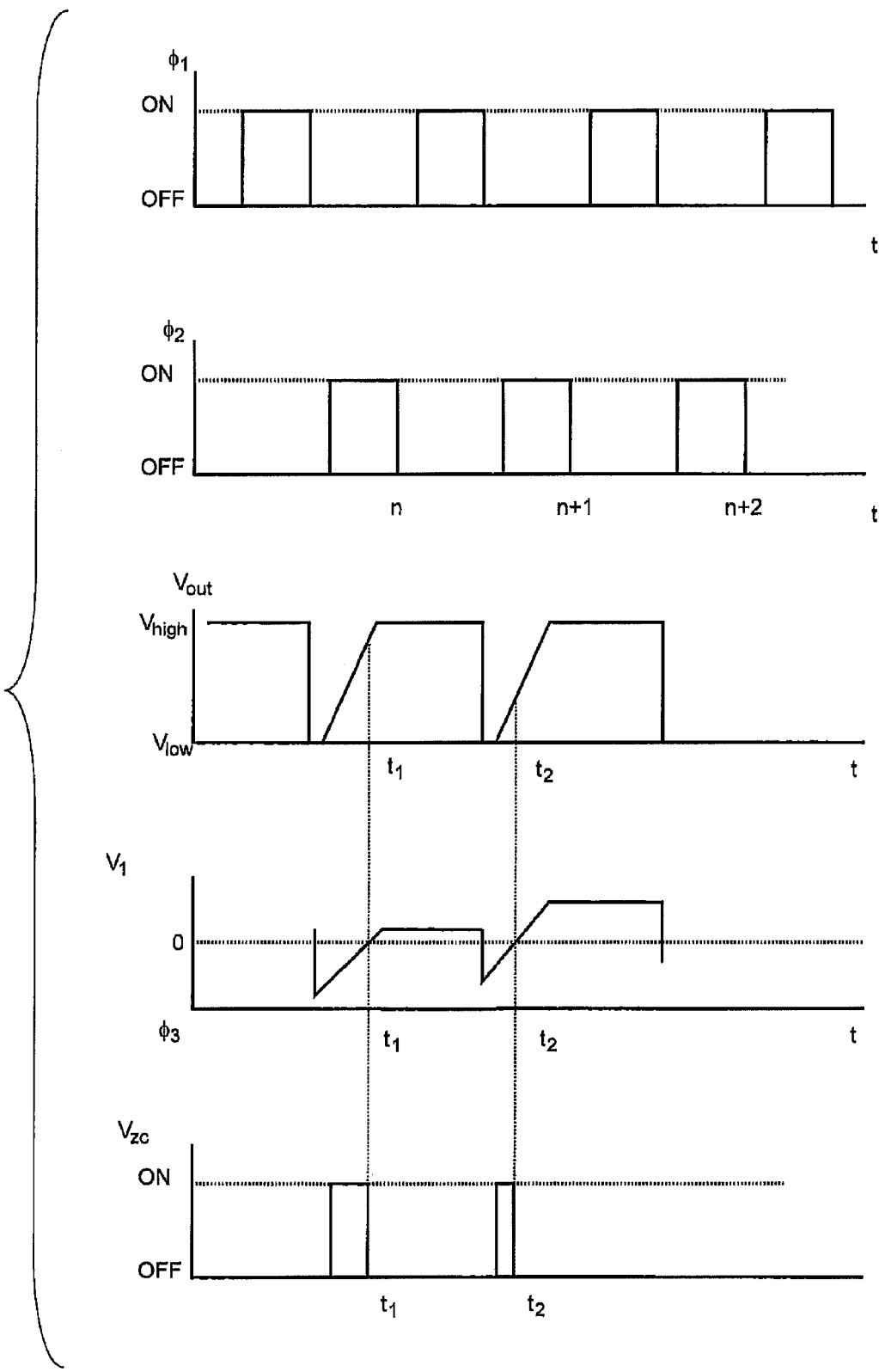
FIG. 5 illustrates a timing diagram for the non-inverting integrator of FIG. 4.

In the timing diagram shown in FIG. 5, the waveform generated by the waveform generator 20 is shown as a ramp. When $v_1$, the voltage at Node 100, crosses zero at time $t_1$, the output $v_{zc}$ of the zero crossing detector 30 goes low, turning the switch $S_{23}$ OFF. At that instant, the output voltage $v_{out}$ is sampled on $C_{S2}$.

Since $v_1$ is very close to zero when the sample of $v_{zc}$ is taken, an accurate output voltage is sampled on $C_{S2}$. A similar operation repeats during the next clock cycle, and the sample of the output voltage is taken at time $t_2$.

It is noted that the zero crossing detector 30 may optionally have an overflow detection feature that determines when the charge in capacitors $C_{S1}$ and $C_{I1}$ is outside the normal range of operation. It can be implemented by a logic circuit that makes the output $v_{zc}$ of the zero-crossing detector 30 go low when $\phi_2$ goes low. In the event $v_1$ fails to cross zero, the sample is taken on the falling edge of $\phi_2$. At the same time, the logic circuit produces a flag indicating overflow.

In the embodiment described above and in the various embodiments described below, a zero crossing detector is utilized in lieu of a comparator. Typically, a comparator is designed to compare two arbitrary input voltages. A comparator may be implemented as cascaded amplifiers, a regenerative latch, or a combination of both. A comparator may be used to detect a zero voltage level or a predetermined voltage level crossing.

It is noted that the input waveform of the various described embodiments is not arbitrary, but deterministic and repetitive. Thus, the various described embodiments determine the instant the zero voltage level or the predetermined voltage level is crossed than relative amplitudes of the input signals. For such a deterministic input, a zero crossing detector is more efficient.

An example of a zero-crossing detector for the detection of a positive-going input signal is shown in FIG. 1. Initially, node 1 and node 2 are precharged to $V_{DD}$ and ground, respectively. The ramp input voltage $V_{IN}$ is applied according to the zero crossing circuit. At the time the input node crosses the threshold, node 1 is discharged rapidly, and node 2 is pulled up to $V_{DD}$. Since the zero crossing detector in FIG. 1 is a dynamic circuit, there is no DC power consumption, allowing extremely low power and fast operation. For the detection of a zero-crossing of a negative-going signal, a complementary circuit with a PMOS input transistor can be utilized.

Figure 6:
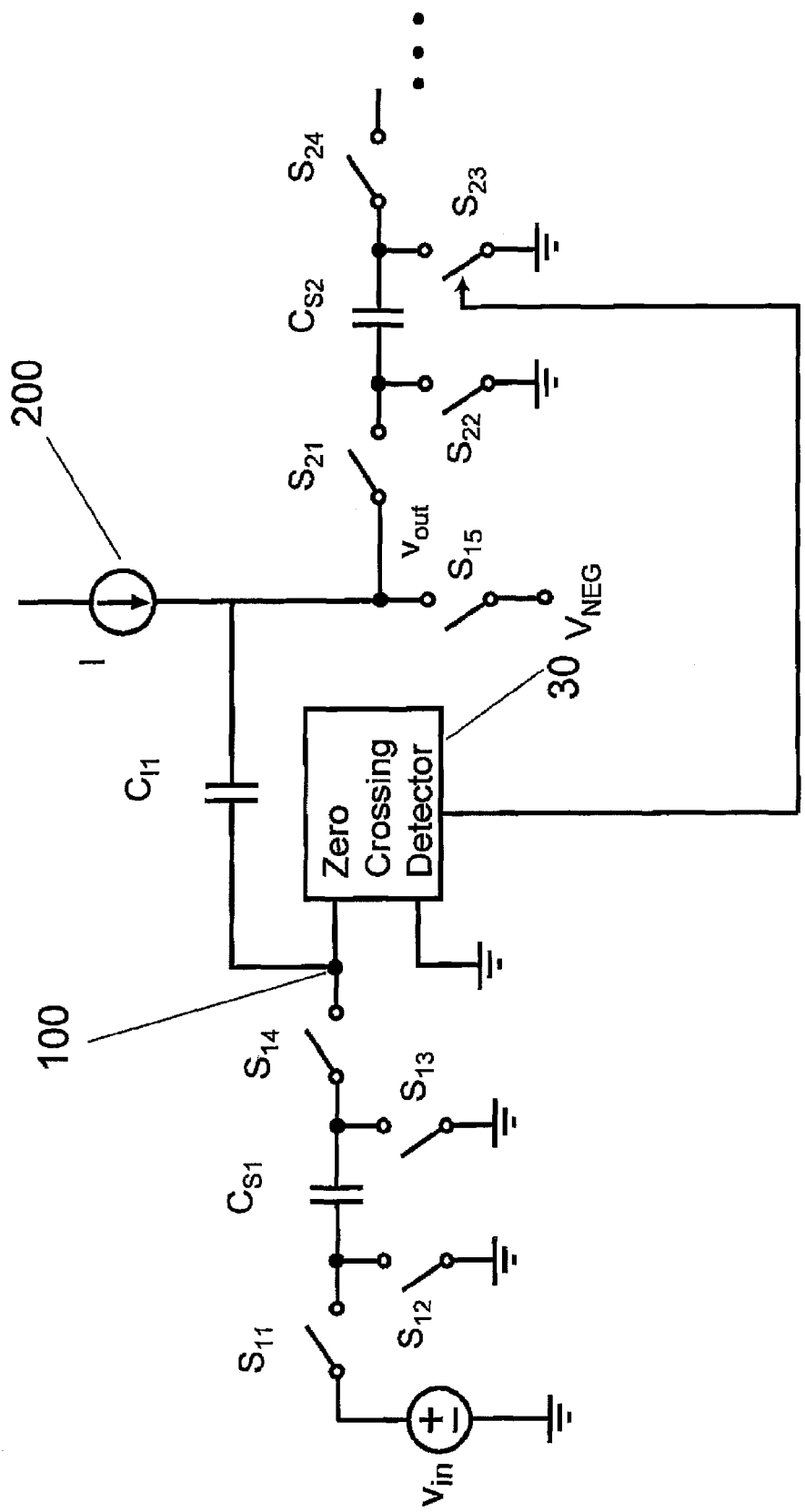
FIG. 6 illustrates a non-inverting integrator with a waveform generator being a current source according to the concepts of the present invention.

As illustrated in FIG. 6, the non-inverting integrator includes a waveform generator which is a current source 200. As illustrated in FIG. 6, a clock phase $\phi_1$ is applied to switches $S_{11}$, $S_{13}$, $S_{22}$, and $S_{24}$, and another phase $\phi_2$ is applied to switches $S_2$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

The current source 200 charges the capacitors $C_{S2}$ and the series connected capacitors $C_{S1}$ and $C_{I1}$, generating a ramp. At the start of $\phi_2$, the output is briefly shorted to a known voltage $V_{NEG}$, the value of which is chosen to ensure the voltage $v_1$ at Node 100 crosses zero with signals in the normal operating range.

Figure 7:
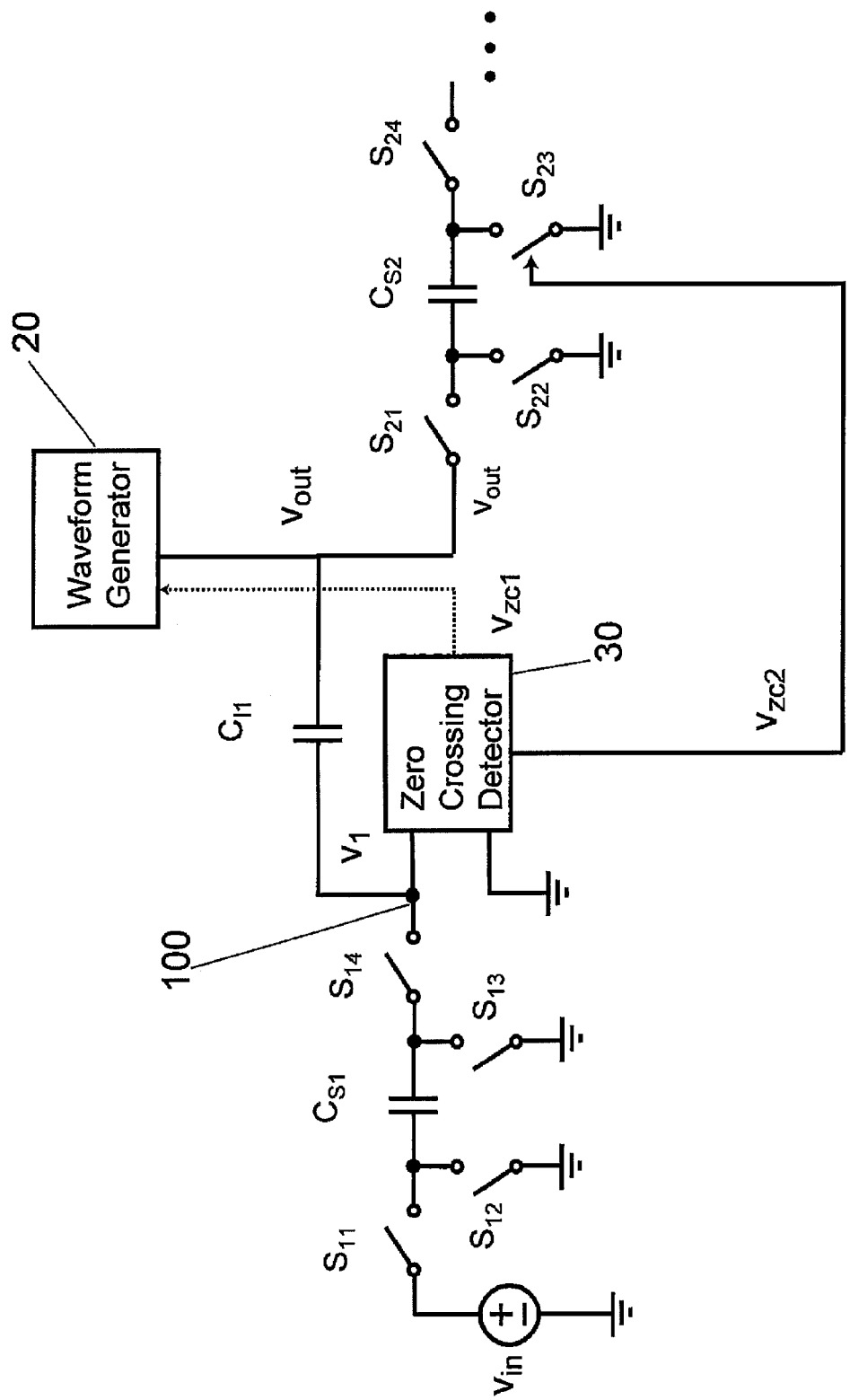
FIG. 7 illustrates another non-inverting integrator according to the concepts of the present invention.

As illustrated in FIG. 7, the non-inverting integrator includes a waveform generator 20 that produces, preferably, a plurality of segments in the waveform with varying rate of change of the output voltage. The first segment may be controlled so as to have the highest rate of change, with subsequent segments having progressively lower rate of change. The detection of zero crossing by the zero crossing detector 30 causes the waveform to advance to the next segment. An output signal $v_{zc2}$ of the zero crossing detector 30 remains high until the zero crossing is detected in the last segment of the waveform.

Figure 8:
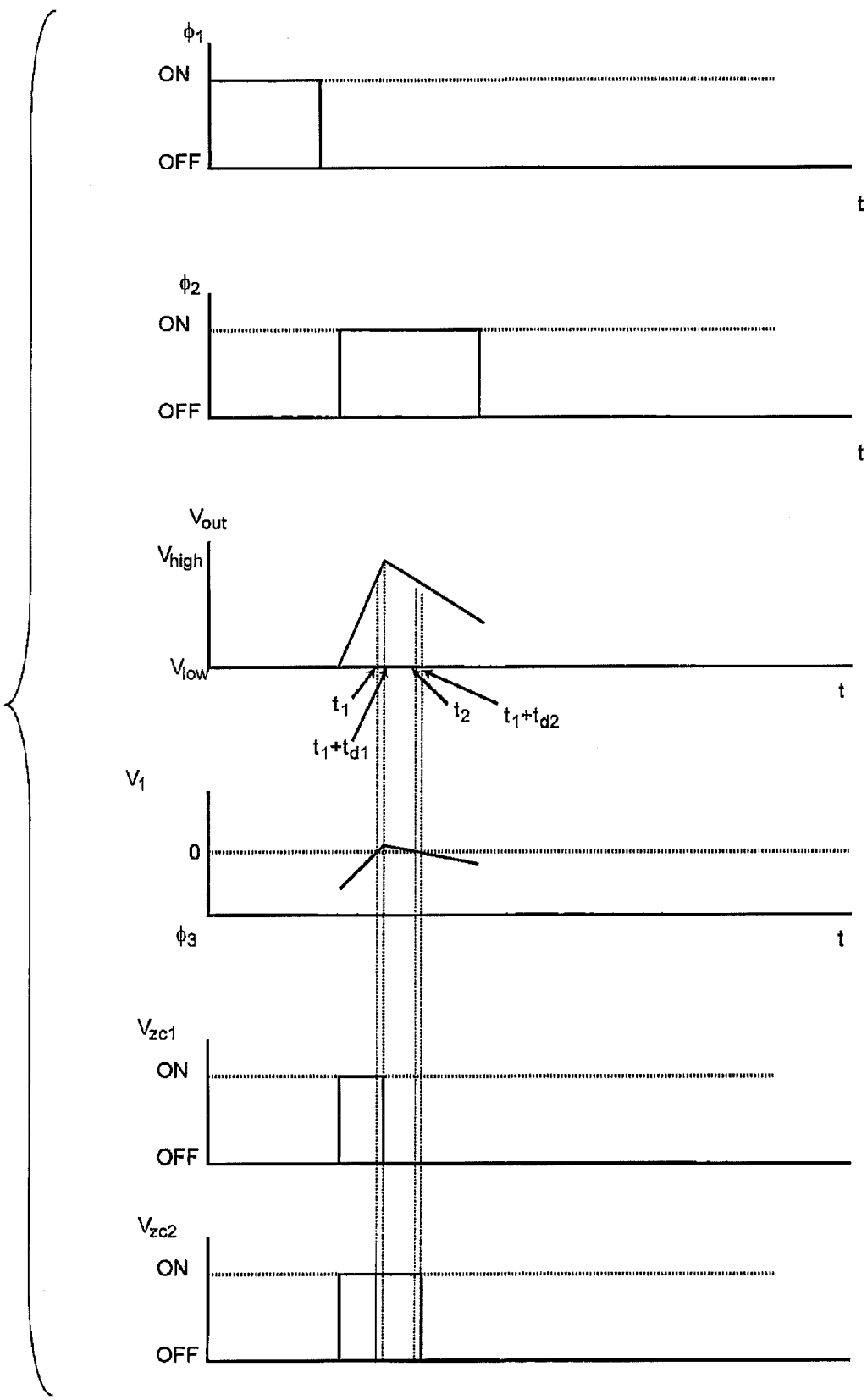
FIG. 8 illustrates a timing diagram for the non-inverting integrator of FIG. 7.

One clock cycle of the timing diagram is shown in FIG. 8. At the start of $\phi_2$, the waveform generator 20 produces an up ramp. The voltage $v_1$ is shown to cross zero at time $t_1$. One output, $v_{zc1}$, of the zero crossing detector 30 changes its state after a finite delay $t_{d1}$.

The delay $t_{d1}$ represents finite delay of a typical zero crossing detector 30. This change of state advances the waveform to the next segment.

Due to the $t_{d1}$ of the zero crossing detector 30, the voltage $v_1$ overshoots by a small amount above ground. The second segment of the waveform generator is a down ramp to permit another zero crossing at time $t_2$. After a second delay $t_{d2}$, the output $v_{zc2}$ of the zero crossing detector 30 goes low, causing the switch $S_{23}$ to turn OFF, locking the sample of the output voltage $v_{out}$.

The delay $t_{d2}$ of the second zero crossing is not necessarily the same as the delay associated with the first zero crossing $t_{d1}$. The delay $t_{d2}$ contributes a small overshoot to the sampled output voltage. The effect of the overshoot can be shown to be constant offset in the sampled charge. In most sampled-data circuits, such constant offset is of little issue.

The zero crossing detector 30 preferably becomes more accurate in detecting the zero crossing as the segments of the waveform advances. The first detection being a coarse detection, it doesn't have to be very accurate. Therefore, the detection can be made faster with less accuracy. The last zero crossing detection in a given cycle determines the accuracy of the output voltage. For this reason, the last zero crossing detection must be the most accurate.

The accuracy, speed, and the power consumption can be appropriately traded among progressive zero crossing detections for the optimum overall performance. For example, the first detection is made less accurately and noisier but is made faster (shorter delay) and lower power. The last detection is made more accurately and quieter while consuming more power or being slower (longer delay).

An example of a two-segment waveform generator constructed of two current sources (210 and 220) is shown in FIG.

Figure 9:
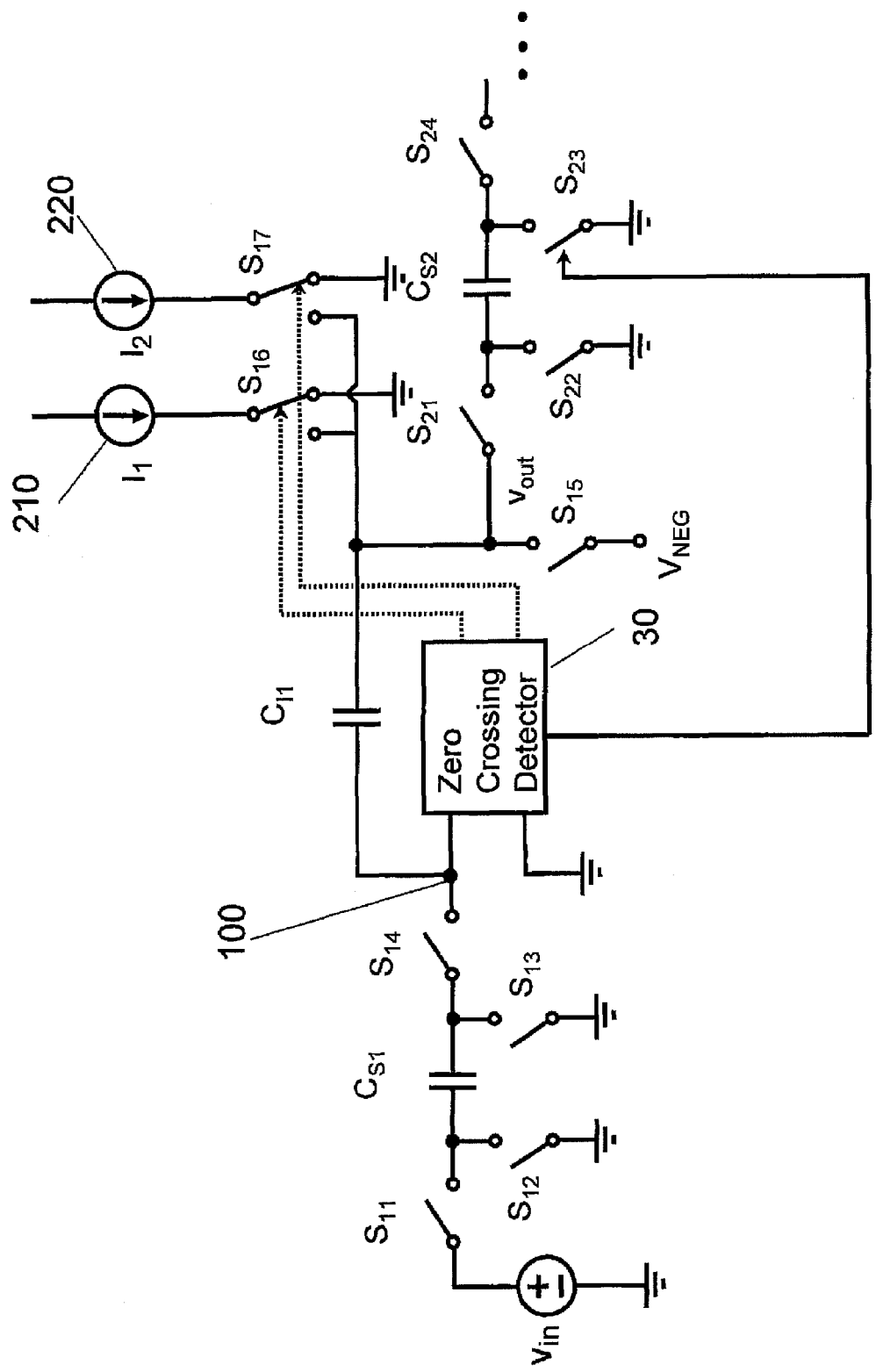
FIG. 9 illustrates another non-inverting integrator according to the concepts of the present invention.

9. As illustrated in FIG. 9, a clock phase $\phi_3$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

Current sources 210 and 220 charge the capacitors $C_{S2}$ and the series connected $C_{S1}$ and $C_{I1}$ generating two segments of a ramp waveform. At the start of $\phi_2$, the output is briefly shorted to a known voltage $V_{NEG}$, the value of which is chosen to ensure the voltage $v_1$ crosses zero with signals in the normal operating range. During the first segment, the current source 210 is directed to the output, while during the second segment, the current source 220 is directed to the output, generating two different slopes of ramp.

Figure 10:
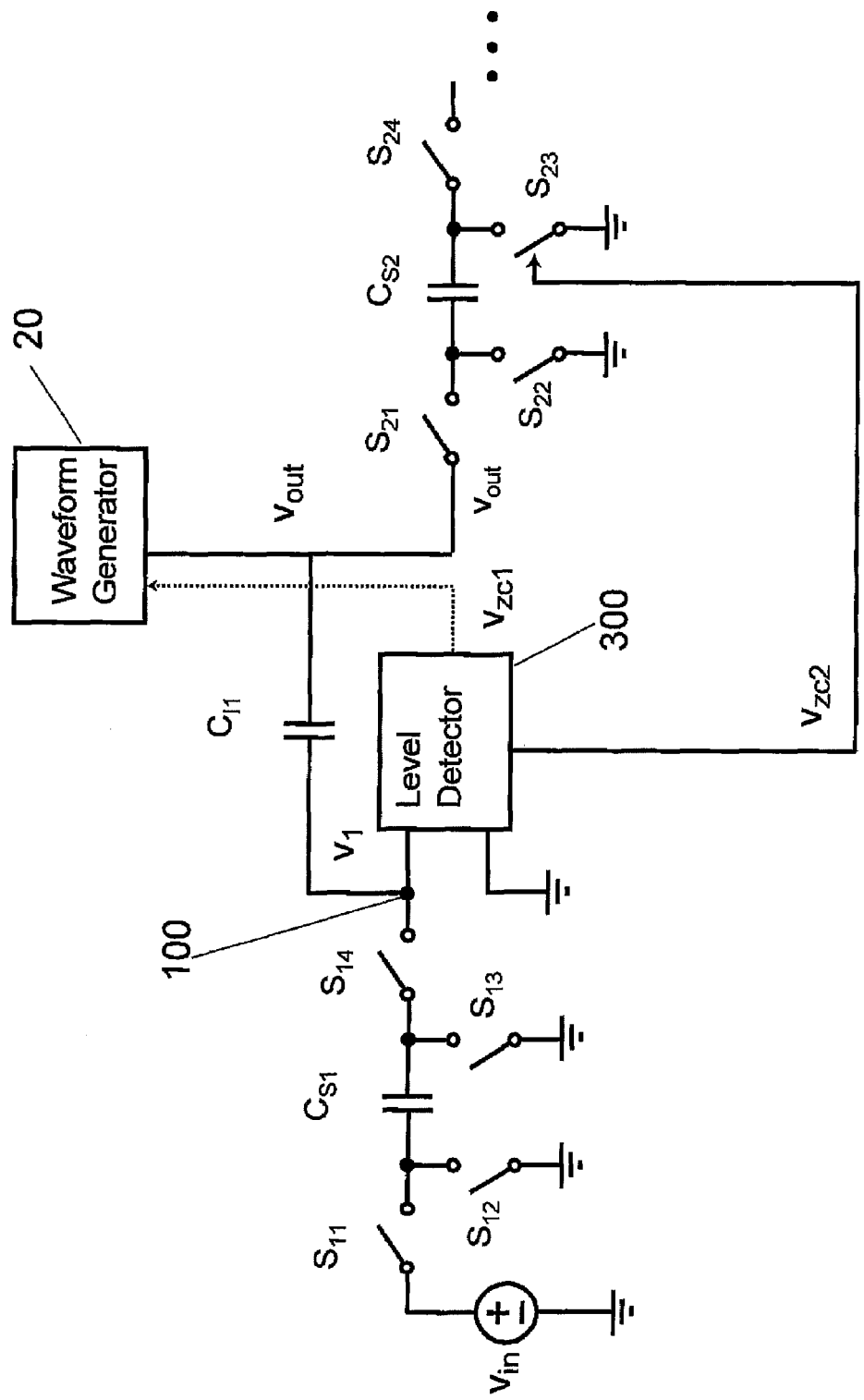
FIG. 10 illustrates another non-inverting integrator according to the concepts of the present invention.

As illustrated in FIG. 10, the non-inverting integrator includes a level crossing detector 300 having plurality of thresholds. As illustrated in FIG. 10, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A level crossing detector 300 is used to detect the point of time at which Node 100 crosses one of plurality of predetermined levels as discussed below. The switch $S_{23}$ is controlled by the output of the level crossing detector 300. The output of the level crossing detector 300 is used to determine the time point to take the sample of the output voltage $v_{out}$.

The thresholds are predetermined voltage levels. The thresholds of the level crossing detector 300 can be adjusted to minimize overshoot.

Figure 11:
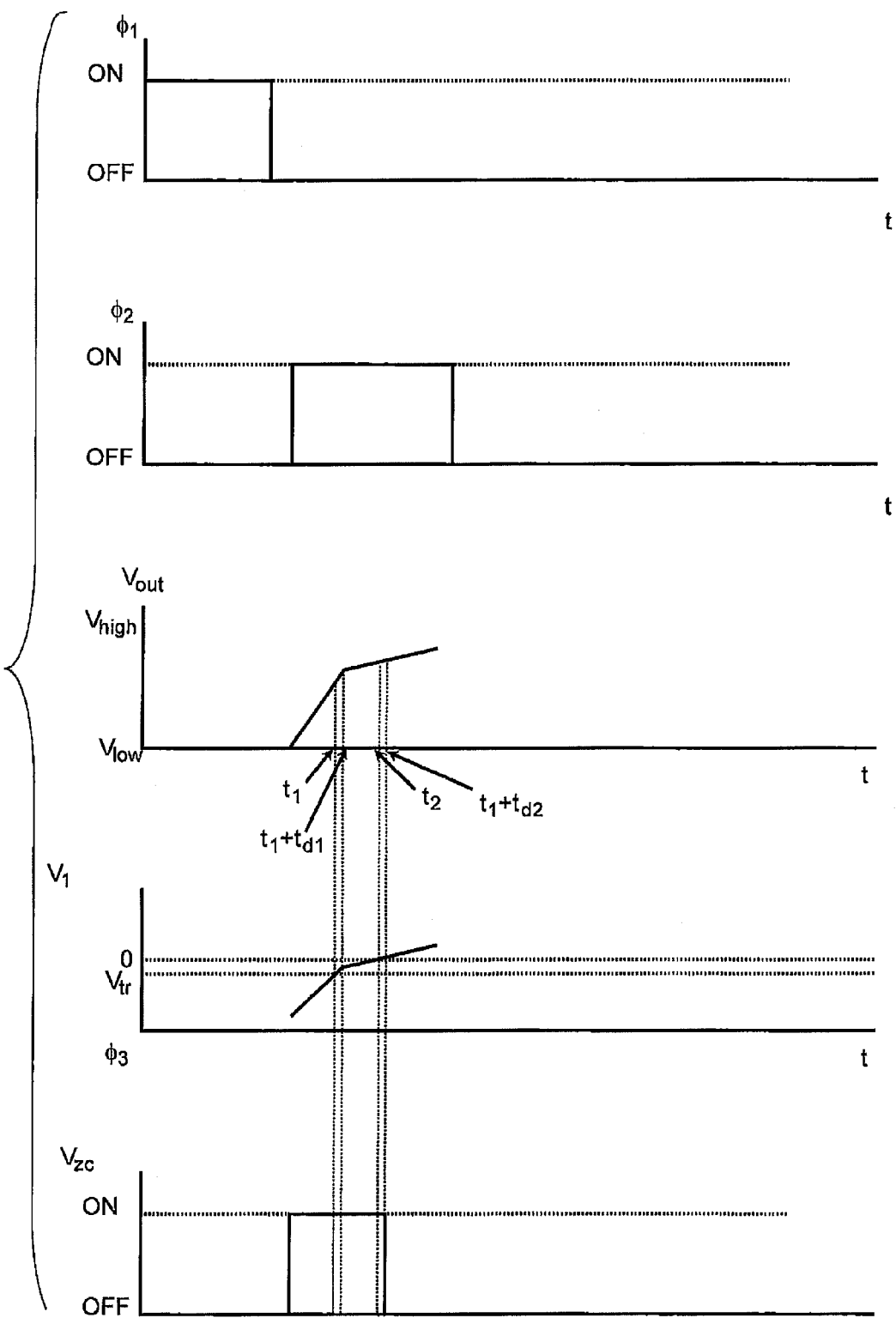
FIG. 11 illustrates a timing diagram for the non-inverting integrator of FIG. 10.

For example, the threshold for the first detection may be made negative by a slightly smaller amount than the expected overshoot in the first segment. This minimizes the ramp-down time in the second segment. Also, the threshold for the second segment may be made more positive by the amount of the overshoot in the second segment in order to cancel the effect of the overshoot. Alternatively, the threshold for the first segment may be made more negative than the expected overshoot during the first segment. This permits the second segment to be a positive ramp rather than a negative ramp as shown in FIG. 11.

It is advantageous to make the detection during the last segment to be the most accurate detection. The accuracy of the detection during the last segment is made higher than during other segments. This can be achieved by making the delay longer or making the power consumption higher during the last segment.

Figure 12:
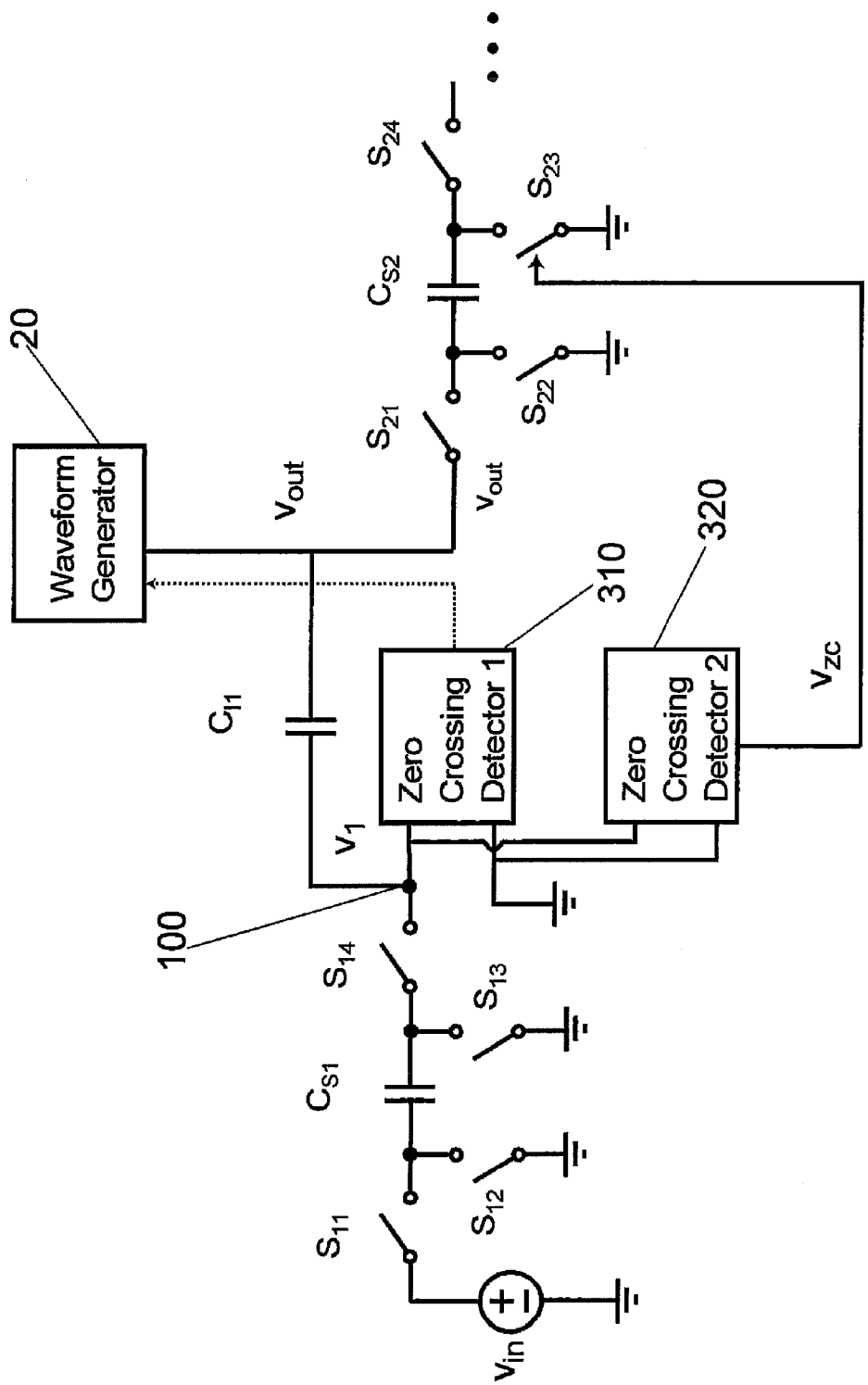
FIG. 12 illustrates another non-inverting integrator according to the concepts of the present invention.

As illustrated in FIG. 12, the non-inverting integrator includes a level crossing detector having two zero-crossing detectors, Zero Crossing Detector 1 (310) and Zero Crossing Detector 2 (320). As illustrated in FIG. 12, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

The thresholds of the Zero Crossing Detector 1 (310) and Zero Crossing Detector 2 (320) are selected to minimize overshoot. For example, the threshold for Zero Crossing Detector 1 (310) may be made negative by a slightly smaller amount than the expected overshoot in the first segment. This minimizes the ramp-down time in the second segment. Also, the threshold for Zero Crossing Detector 2 (320) may be made more positive by the amount of the overshoot in the second segment in order to cancel the effect of the overshoot. Alternatively, the threshold for Zero Crossing Detector 1 (310) may be made more negative than the expected overshoot during the first segment. This permits Zero Crossing Detector 2 (320) to be a positive ramp rather than a negative ramp.

In other words, Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 13:
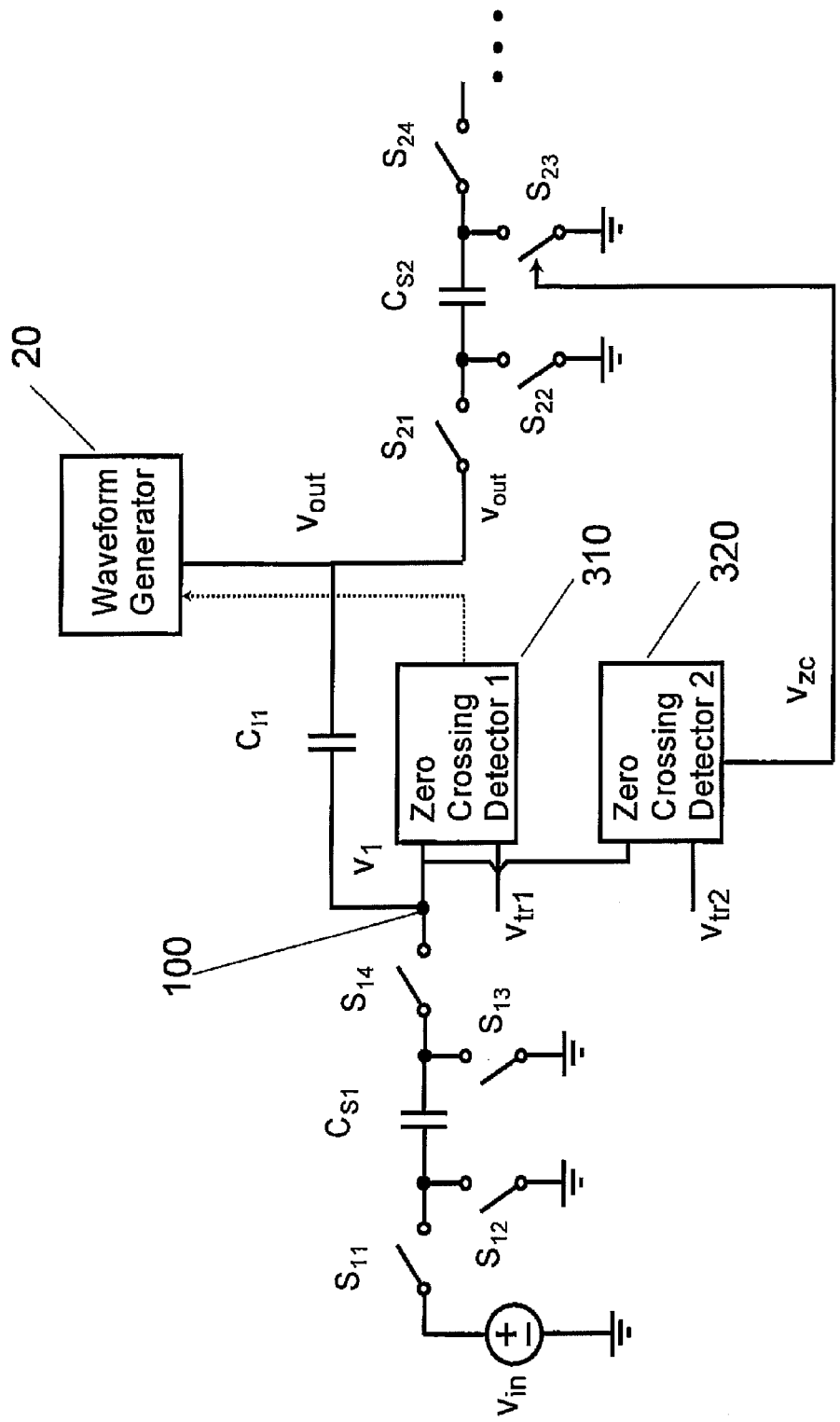
FIG. 13 illustrates another non-inverting integrator according to the concepts of the present invention.

As illustrated in FIG. 13, the non-inverting integrator includes a level crossing detector having two zero-crossing detectors, Zero Crossing Detector 1 (310) and Zero Crossing Detector 2 (320). As illustrated in FIG. 13, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

Both detectors, Zero Crossing Detector 1 (310) and Zero Crossing Detector 2 (320), have nominally zero thresholds. The detection thresholds are determined by voltages $V_{tr1}$ and $V_{tr2}$ applied to the inputs of Zero Crossing Detector 1 (310) and Zero Crossing Detector 2 (320), respectively. Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 14:
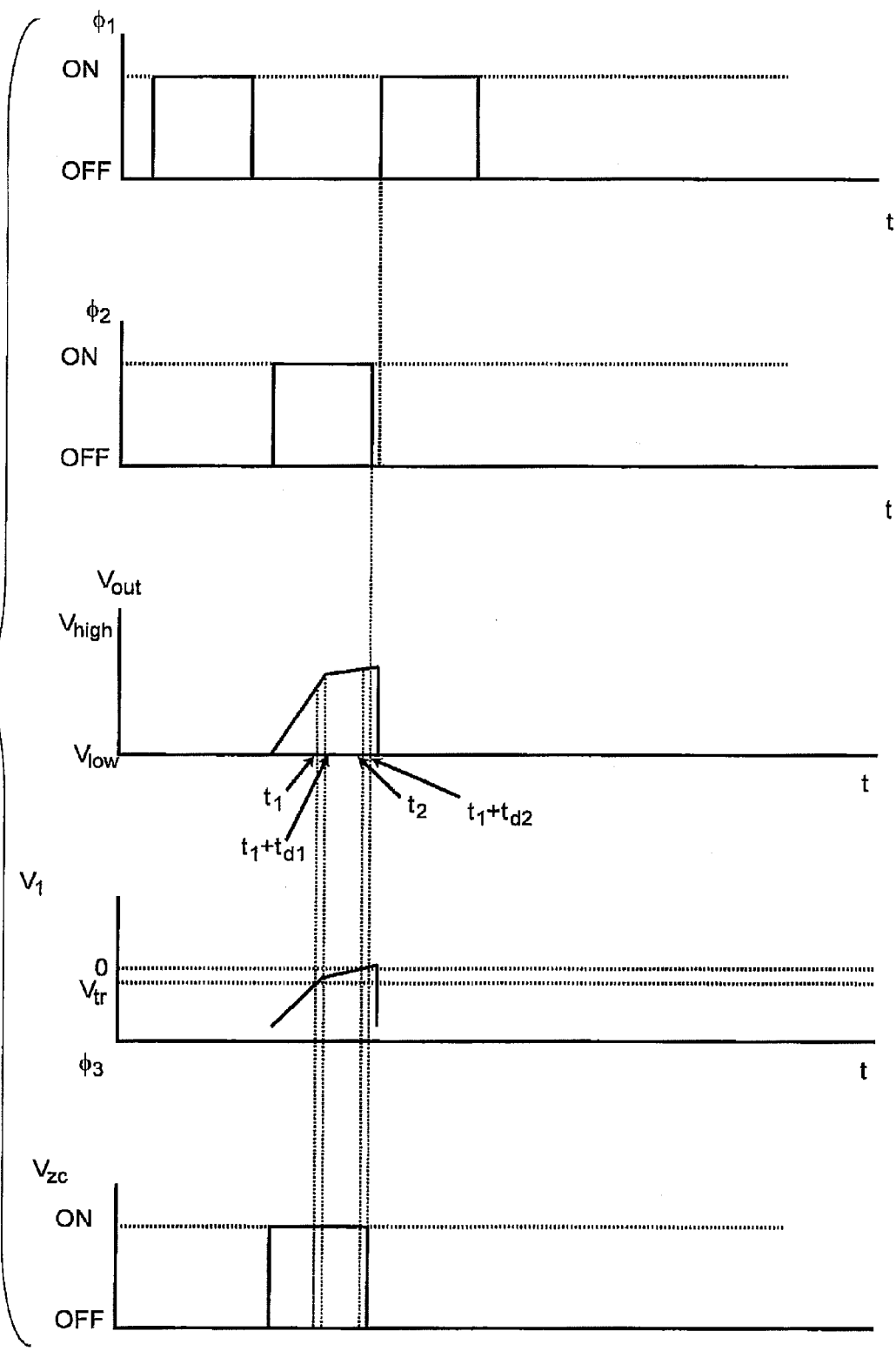
FIG. 14 illustrates a timing diagram for the non-inverting integrator of FIG. 13.

It is noted that the above-described embodiment may operate as a self-timed system. In this configuration, Rather than supplying constant frequency clock phases $\phi_1$ and $\phi_2$, the clock phases are derived from the outputs of Zero Crossing Detector 1 (310) and Zero Crossing Detector 2 (320). FIG. 14 illustrates a self-timed operation.

As illustrated in FIG. 14, the end of the phase $\phi_2$ is defined by the output of the detection during the last segment. The beginning of the clock phase $\phi_1$ is defined by a short delay, such as logic delays, after the end of $\phi_2$. The short delay is generally necessary to ensure non-overlapping clock phases. The end of the clock phase $\phi_1$ is determined by the zero crossing detection of the previous stage or the following stage in the similar manner.

It is noted that the various embodiments described above can be utilized in a pipeline analog-to-digital converter, an algorithmic analog-to-digital converter, a switched-capacitor amplifier, a delta-sigma modulator, or a self-timed algorithmic analog-to-digital converter.

It is further noted that the various embodiments described above have signal paths that are single-ended, thus, it is desirable to provide differential signal paths. The various embodiments described below provide differential signal paths.

Figure 15:
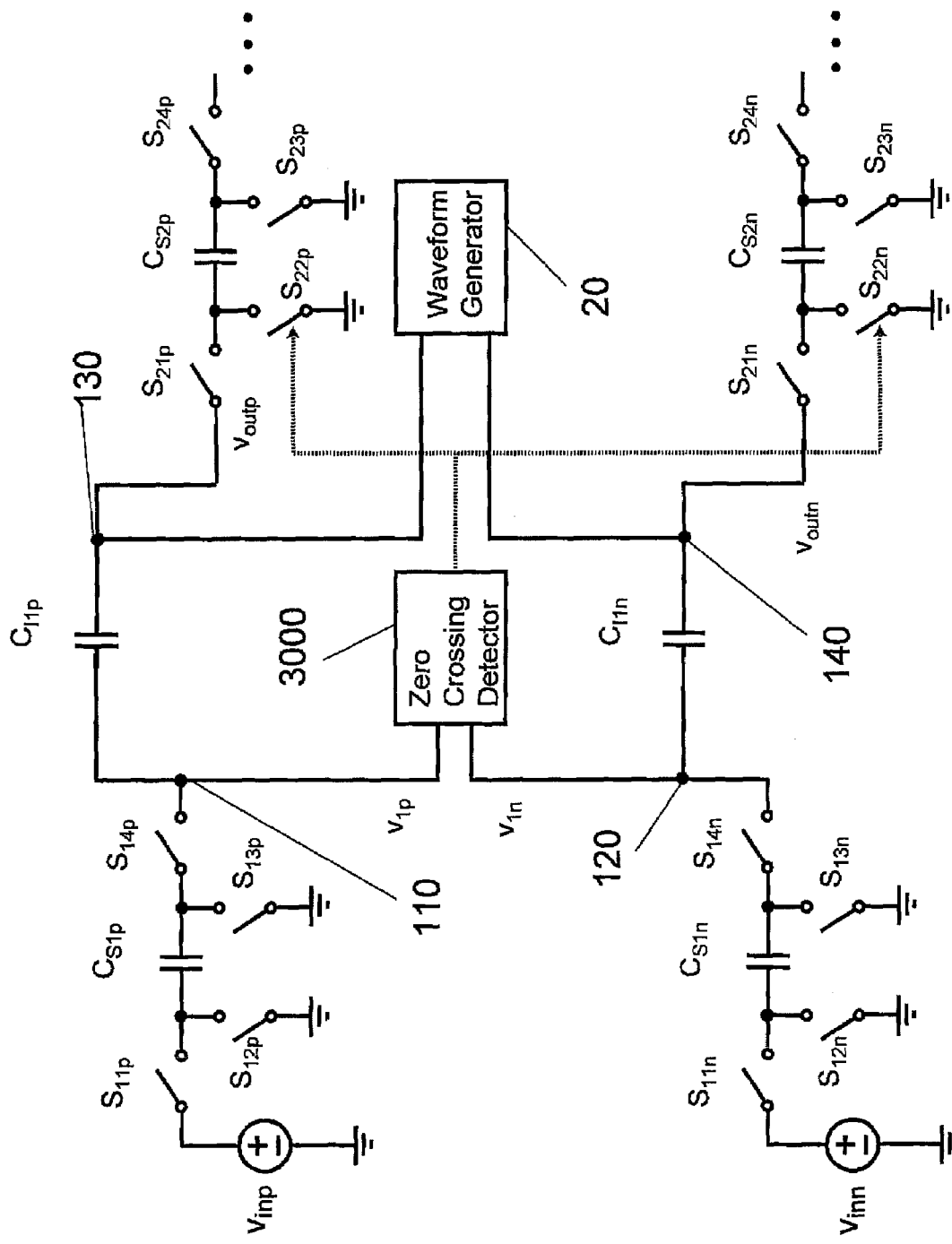
FIG. 15 illustrates a non-inverting integrator with differential signal paths according to the concepts of the present invention.

FIG. 15 illustrates another example of a non-inverting integrator with half-clock delay shown. In FIG. 15, there are two signal paths, the true path and the complementary path. The true signal path comprises capacitors ($C_{S1p}$, $C_{I1p}$, and $C_{S2p}$) and switches ($S_{11p}$, $S_{12p}$, $S_{13p}$, $S_{14p}$, $S_{21p}$, $S_{22p}$, $S_{23p}$, and $S_{24p}$). The complementary signal path comprises capacitors ($C_{S1n}$, $C_{I1n}$, and $C_{S2n}$) and switches ($S_{11n}$, $S_{12n}$, $S_{13n}$, $S_{14n}$, $S_{21n}$, $S_{22n}$, $S_{23n}$, and $S_{24n}$). A clock phase $\phi_1$ is applied to switches $S_{11p}$, $S_{13p}$, $S_{22p}$, $S_{24p}$, $S_{11n}$, $S_{13n}$, $S_{22n}$, and $S_{24n}$, and another clock phase $\phi_2$ is applied to switches $S_{12p}$, $S_{14p}$, $S_{21p}$, $S_{12n}$, $S_{14n}$, and $S_{21n}$. A zero crossing detector 300 is used to detect the point of time at which Node 110 and Node 120 voltages cross each other. The sampling switches $S_{23p}$ and $S_{23n}$ are controlled by the output of the zero crossing detector 300. The output of the zero crossing detector 300 is used to determine the time point to take the samples of the output voltages $v_{outp}$ and $v_{outn}$.

Figure 16:
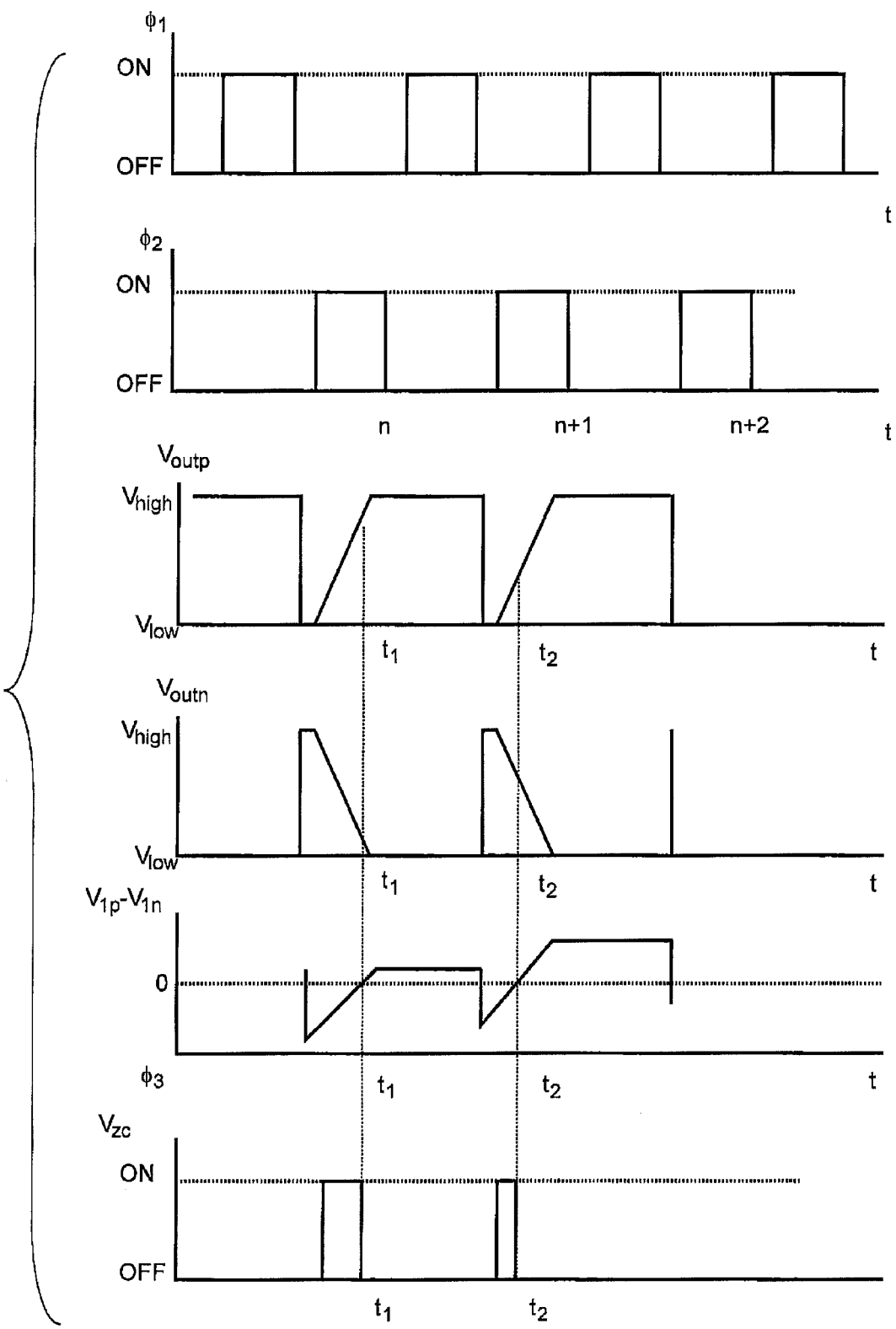
FIG. 16 illustrates a timing diagram for the non-inverting integrator of FIG. 15.

The waveform generator 20 generates a differential voltage waveform at the output nodes (130 and 140) in such way the difference of voltages at Node 110 and Node 120 ($v_{1p}-v_{1n}$) cross zero if the charge in capacitors $C_{S1p}$, $C_{I1p}$, $C_{S1n}$, and $C_{I1n}$ is within a normal operating range. In the timing diagram shown in FIG. 16, the waveforms for $v_{outp}$ and $v_{outn}$ generated by the waveform generator 20 are shown as a positive going ramp and a negative going ramp, respectively.

The waveform generator 20 optionally includes a common-mode-feedback circuit to keep the common-mode output voltage $(v_{1p}+v_{1n})/2$ substantially constant. When $v_{1p}-v_{1n}$ crosses zero at time $t_1$, the output $v_{zc}$ of the zero crossing detector 300 goes low, turning the switches $S_{23p}$ and $S_{23n}$ OFF. At that instant, the output voltages $v_{outp}$ and $v_{outn}$ are sampled on $C_{S2p}$ and $C_{S2n}$, respectively. Since $v_{1p}-v_{1n}$ is very close to zero when the sample of $v_{outp}$ and $v_{outn}$ are taken, accurate output voltages are sampled on $C_{S2p}$ and $C_{S2p}$. The operations are repeated for the next clock cycle, and the samples of the output voltages are taken at time $t_2$.

The zero crossing detector 300 optionally has an overflow detection feature that determines the charge in capacitors $C_{S1p}$, $C_{I1p}$, $C_{S1n}$, and $C_{I1n}$ is outside the normal range of operation. It can be implemented by a logic circuit that makes the output $v_{zc}$ of the zero-crossing detector 300 to go low when $\phi_2$ goes low.

In the event $v_1$ fails to cross zero, the sample is taken on the falling edge of $\phi_2$. At the same time, the logic circuit produces a flag indicating overflow.

Figure 17:
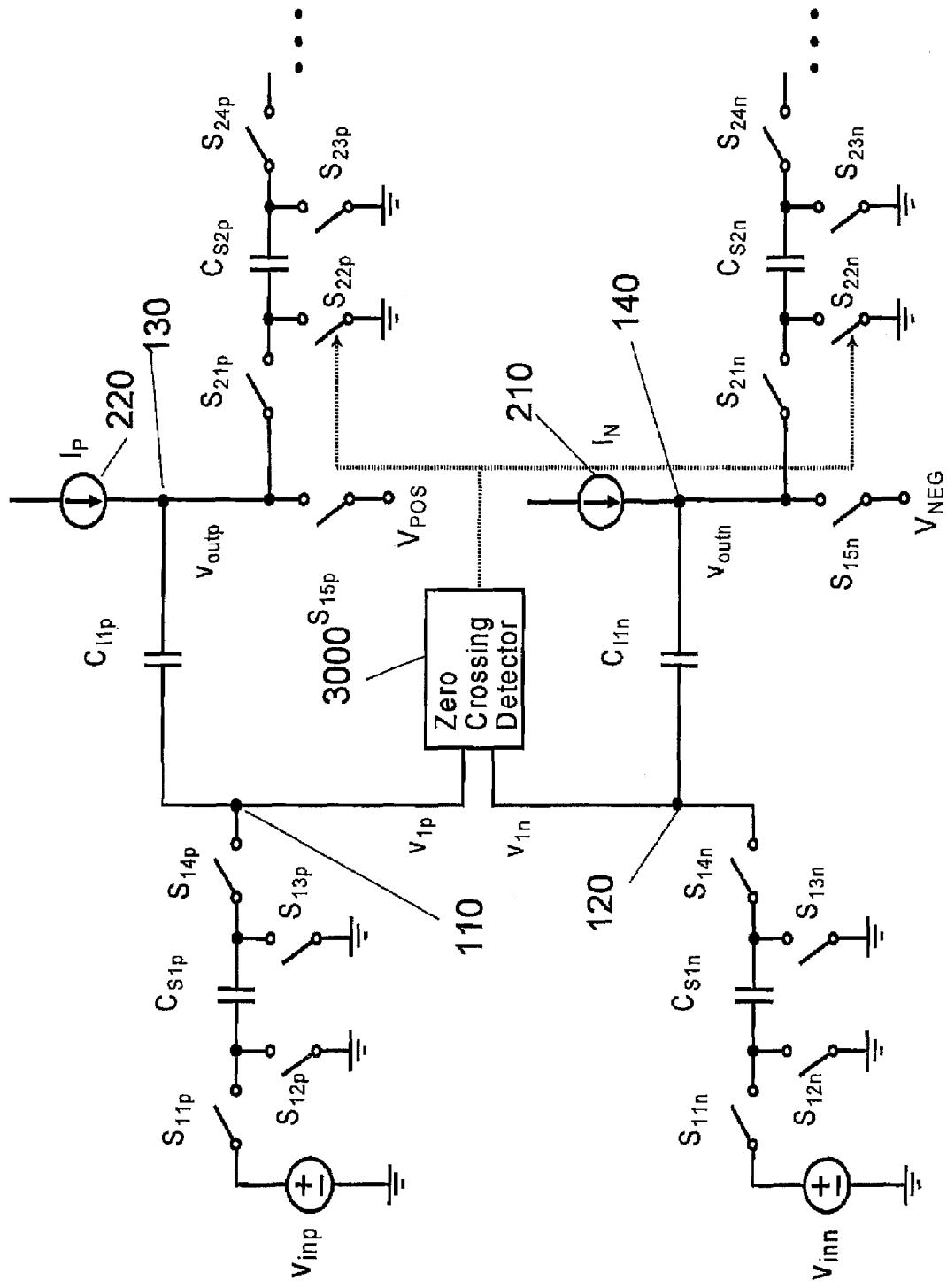
FIG. 17 illustrates another non-inverting integrator with differential signal paths according to the concepts of the present invention.

FIG. 17 illustrates another example of a non-inverting integrator with half-clock delay shown. In FIG. 17, there are two signal paths, the true path and the complementary path. The true signal path comprises capacitors ($C_{S1p}$, $C_{I1p}$, and $C_{S2p}$) and switches ($S_{11p}$, $S_{12p}$, $S_{13p}$, $S_{14p}$, $S_{21p}$, $S_{22p}$, $S_{23p}$, and $S_{24p}$). The complementary signal path comprises capacitors ($C_{S1n}$, $C_{I1n}$, and $C_{S2n}$) and switches ($S_{11n}$, $S_{12n}$, $S_{13n}$, $S_{14n}$, $S_{21n}$, $S_{22n}$, $S_{23n}$, and $S_{24n}$). A clock phase $\phi_1$ is applied to switches $S_{11p}$, $S_{13p}$, $S_{22p}$, $S_{24p}$, $S_{11n}$, $S_{13n}$, $S_{22n}$, and $S_{24n}$, and another clock phase $\phi_2$ is applied to switches $S_{12p}$, $S_{14p}$, $S_{21p}$, $S_{12n}$, $S_{14n}$, and $S_{21n}$. A zero crossing detector 300 is used to detect the point of time at which Node 110 and Node 120 voltages cross each other. The sampling switches $S_{23p}$ and $S_{23n}$ are controlled by the output of the zero crossing detector 300. The output of the zero crossing detector 300 is used to determine the time point to take the samples of the output voltages $v_{outp}$ and $v_{outn}$.

The waveform generator 20 generates a differential voltage waveform at the output nodes (130 and 140) in such way the difference of voltages at Node 110 and Node 120 ($v_{1p}-v_{1n}$) cross zero if the charge in capacitors $C_{S1p}$, $C_{S1p}$, $C_{S1n}$, and $C_{I1n}$ is within a normal operating range.

The waveform generator may comprise a pair of current sources (210 and 220), as shown in FIG. 17. The current source 220 charges the capacitors $C_{S2p}$ and the series connected capacitors $C_{S1p}$ and $C_{I1p}$, generating a positive going ramp. The current source 210 charges the capacitors $C_{S2n}$ and the series connected capacitors $C_{S1n}$ and $C_{I1n}$, generating a negative going ramp. The currents 210 and 220 are nominally equal in magnitude and opposite in sign. At the start of $\phi_2$, the outputs $v_{outp}$ and $v_{outn}$ are briefly shorted to a known voltage $V_{NEG}$ and $V_{POS}$, respectively, the values of which are chosen to ensure the voltage $v_{1p}-v_{1n}$ crosses zero with signals in the normal operating range.

Figure 18:
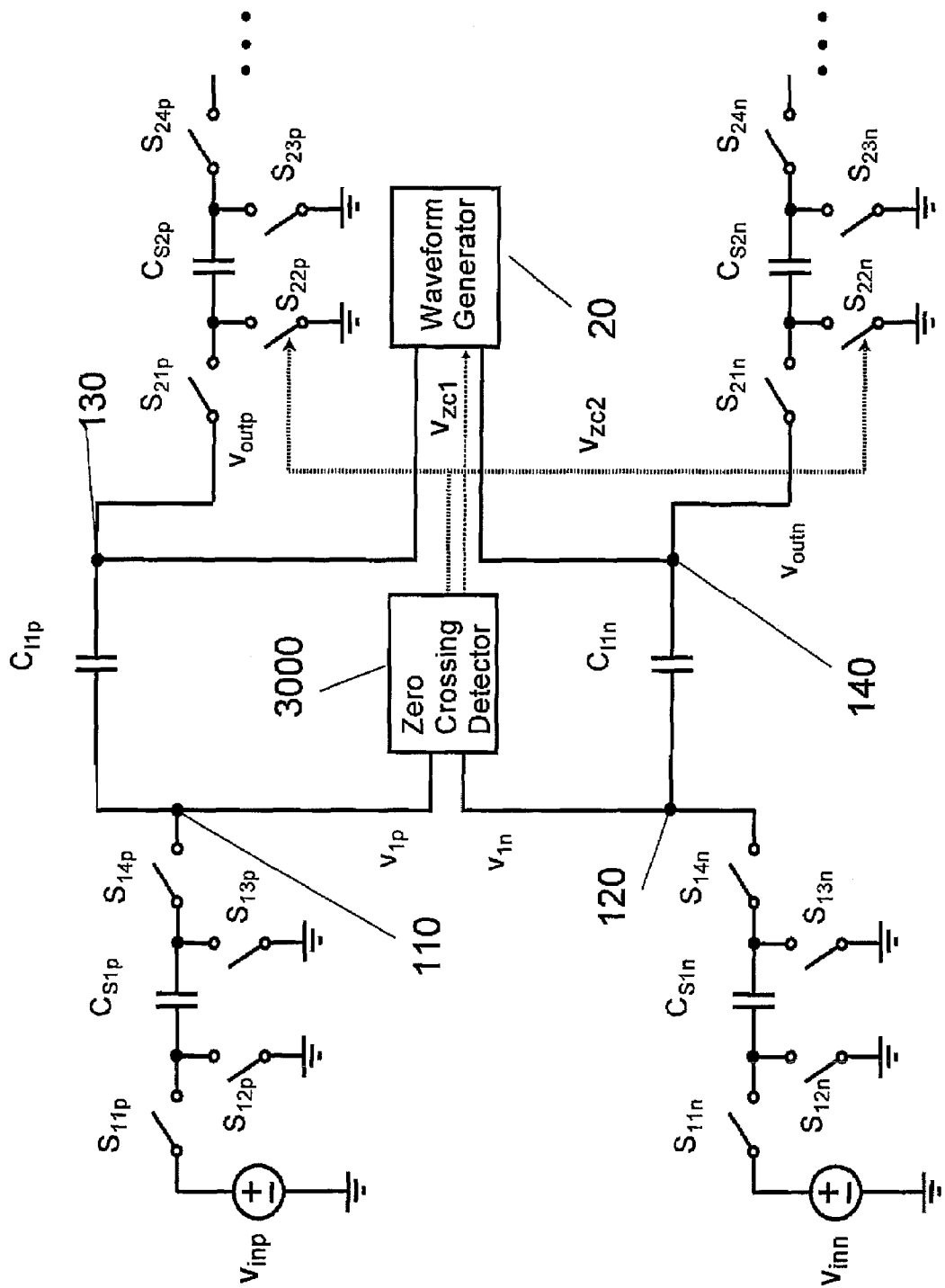
FIG. 18 illustrates another non-inverting integrator with differential signal paths according to the concepts of the present invention.

FIG. 18 illustrates another example of a non-inverting integrator with half-clock delay shown. In FIG. 18, there are two signal paths, the true path and the complementary path. The true signal path comprises capacitors ($C_{S1p}$, $C_{S1p}$, and $C_{S2p}$) and switches ($S_{11p}$, $S_{12p}$, $S_{13p}$, $S_{14p}$, $S_{21p}$, $S_{22p}$, $S_{23p}$, and $S_{24p}$). The complementary signal path comprises capacitors ($C_{S1n}$, $C_{I1n}$, and $C_{S2n}$) and switches ($S_{11n}$, $S_{12n}$, $S_{13n}$, $S_{14n}$, $S_{21n}$, $S_{22n}$, $S_{23n}$, and $S_{24n}$). A clock phase $\phi_1$ is applied to switches $S_{11p}$, $S_{13p}$, $S_{22p}$, $S_{24p}$, $S_{11n}$, $S_{13n}$, $S_{22n}$, and $S_{24n}$, and another clock phase $\phi_2$ is applied to switches $S_{12p}$, $S_{14p}$, $S_{21p}$, $S_{12n}$, $S_{14n}$, and $S_{21n}$. A zero crossing detector 300 is used to detect the point of time at which Node 110 and Node 120 voltages cross each other. The sampling switches $S_{23p}$ and $S_{23n}$ are controlled by the output of the zero crossing detector 300. The output of the zero crossing detector 300 is used to determine the time point to take the samples of the output voltages $v_{outp}$ and $v_{outn}$.

The waveform generator 20 generates a differential voltage waveform at the output nodes (130 and 140) in such way the difference of voltages at Node 110 and Node 120 ($v_{1p}-v_{1n}$) cross zero if the charge in capacitors $C_{S1p}$, $C_{I1p}$, $C_{S1n}$, and $C_{I1n}$ is within a normal operating range.

In FIG. 18, the waveform generator 20 may produce a plurality of segments in the waveforms with varying rate of change of the output voltage. For optimum operation, the first segment may be controlled to have the highest rate of change, with subsequent segments having progressively lower rate of change. The waveform generator 20 may optionally include a common-mode-feedback circuit to keep the common-mode output voltage $(v_{1p}+v_{1n})/2$ substantially constant. The detection of zero crossing by the zero crossing detector 300 causes the waveform to advance to the next segment. An output signal $v_{zc2}$ of the zero crossing detector 300 remains high until the zero crossing is detected in the last segment of the waveform.

Figure 19:
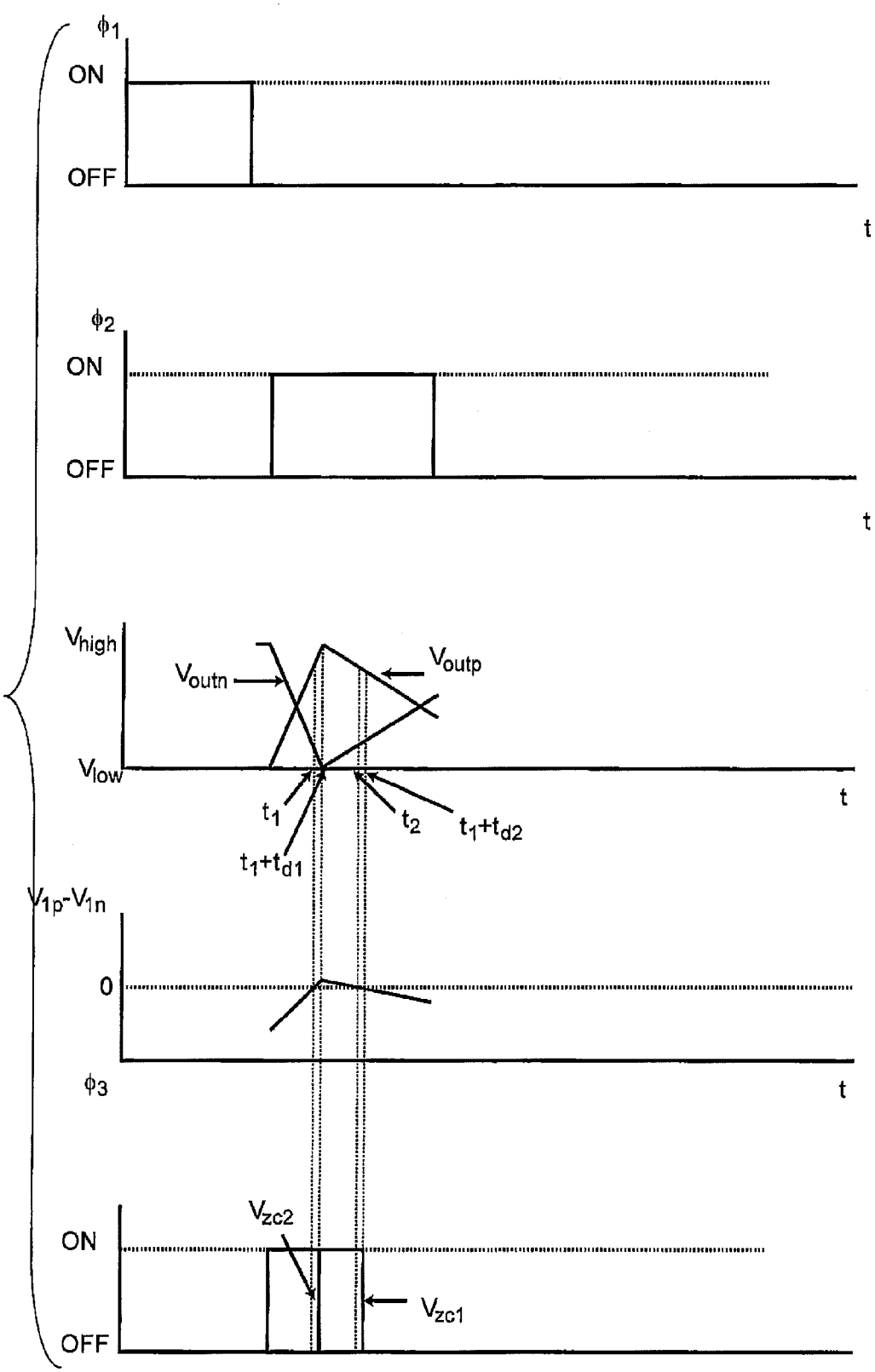
FIG. 19 illustrates a timing diagram for the non-inverting integrator of FIG. 18.

One clock cycle of the timing diagram for the multi-segment circuit of FIG. 18 is shown in FIG. 19. At the start of $\phi_2$, the waveform generator 20 produces an up ramp for $v_{outp}$ and a down ramp for $v_{outn}$. The voltage $v_{1p}-v_{1n}$ is shown to cross zero at time $t_1$. The output, $v_{zc1}$, of the zero crossing detector 300 changes its state after a finite delay $t_{d1}$. The delay $t_{d1}$ represents the finite delay associated with the zero crossing detector 300. This change of state advances the waveform to the next segment.

Due to the $t_{d1}$ of the zero crossing detector 300, the voltage $v_{1p}-v_{1n}$ overshoots by a small amount above zero. The second segment of the waveform generator 20 is a down ramp for $v_{outp}$ and an up ramp for $v_{outn}$ to permit another zero crossing at time $t_2$. After a second delay $t_{d2}$, the output $v_{zc2}$ of the zero crossing detector 300 goes low, causing the switch $S_{23}$ to turn OFF, locking the samples of the output voltages $v_{outp}$ and $v_{outn}$.

The delay $t_{d2}$ of the second zero crossing may not be the same as the delay associated with the first zero crossing $t_{d1}$. The delay $t_{d2}$ contributes a small overshoot to the sampled output voltage. The effect of the overshoot can be shown to be constant offset in the sampled charge. In most sampled-data circuits, such constant offset is of little issue.

The zero crossing detector 300 preferably becomes more accurate in detecting the zero crossing as the segments of the waveform advances. The first detection being a coarse detection, it doesn't have to be very accurate. Therefore, the detection can be made faster with less accuracy. The last zero crossing detection in a given cycle determines the accuracy of the output voltage. For this reason, the last zero crossing detection must be the most accurate.

The accuracy, speed, and the power consumption can be appropriately traded among progressive zero crossing detections for the optimum overall performance. For example, the first detection is made less accurately and noisier but is made faster (shorter delay) and lower power. The last detection is made more accurately and quieter while consuming more power or being slower (longer delay).

Figure 20:
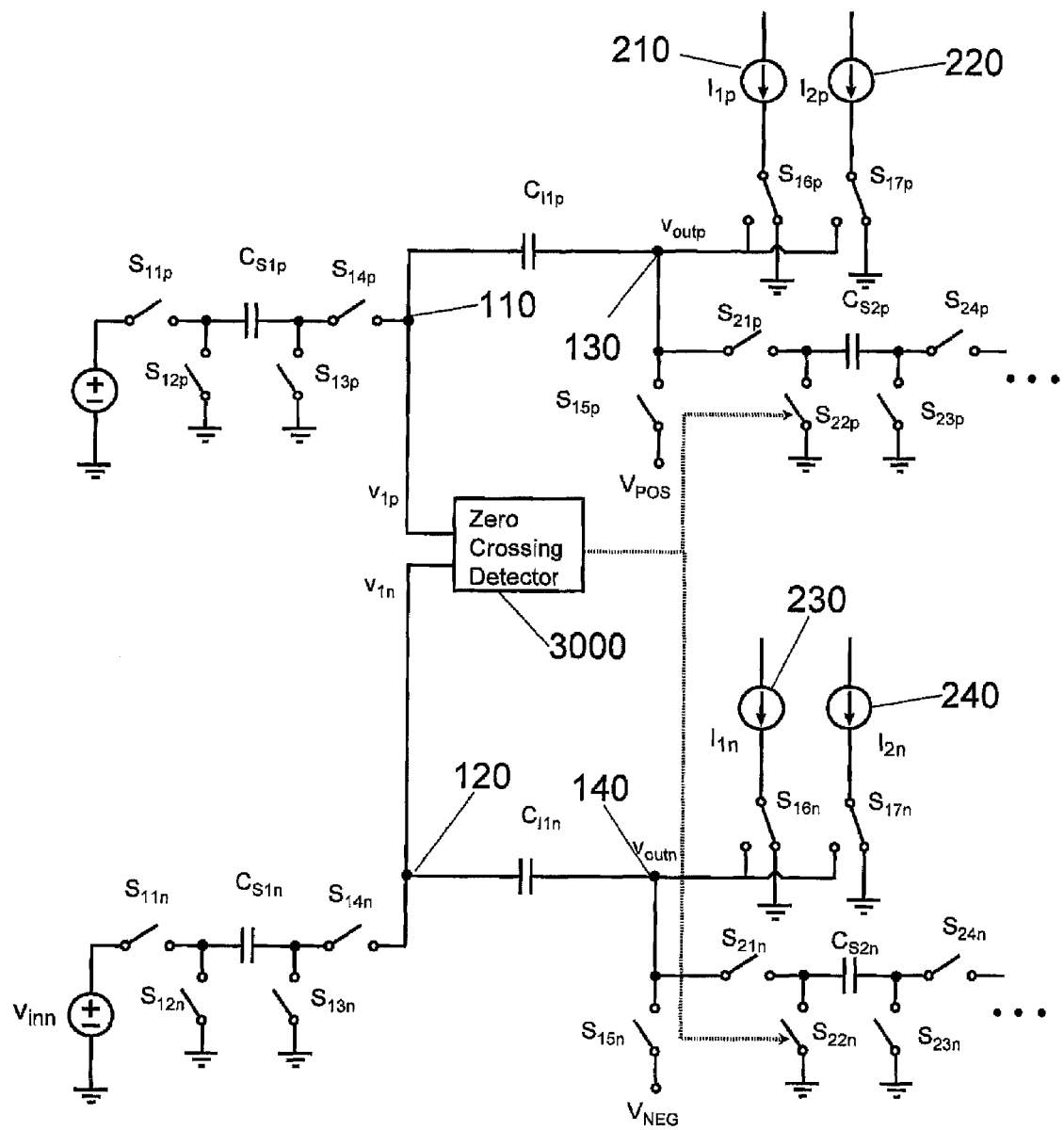
FIG. 20 illustrates another non-inverting integrator with differential signal paths according to the concepts of the present invention.

FIG. 20 illustrates another example of a non-inverting integrator with half-clock delay shown. In FIG. 20, there are two signal paths, the true path and the complementary path. The true signal path comprises capacitors ($C_{S1p}$, $C_{I1p}$, and $C_{S2p}$) and switches ($S_{11p}$, $S_{12p}$, $S_{13p}$, $S_{14p}$, $S_{21p}$, $S_{22p}$, $S_{23p}$, and $S_{24p}$). The complementary signal path comprises capacitors ($C_{S1n}$, $C_{I1n}$, and $C_{S2n}$) and switches ($S_{11n}$, $S_{12n}$, $S_{13n}$, $S_{14n}$, $S_{21n}$, $S_{22n}$, $S_{23n}$, and $S_{24n}$). A clock phase $\phi_1$ is applied to switches $S_{11p}$, $S_{13p}$, $S_{22p}$, $S_{24p}$, $S_{11n}$, $S_{13n}$, $S_{22n}$, and $S_{24n}$, and another clock phase $\phi_2$ is applied to switches $S_{12p}$, $S_{14p}$, $S_{21p}$, $S_{12n}$, $S_{14n}$, and $S_{21n}$. A zero crossing detector 300 is used to detect the point of time at which Node 110 and Node 120 voltages cross each other. The sampling switches $S_{23p}$ and $S_{23n}$ are controlled by the output of the zero crossing detector 300. The output of the zero crossing detector 300 is used to determine the time point to take the samples of the output voltages $v_{outp}$ and $v_{outn}$.

The waveform generator 20 generates a differential voltage waveform at the output nodes (130 and 140) in such way the difference of voltages at Node 110 and Node 120 ($v_{1p}-v_{1n}$) cross zero if the charge in capacitors $C_{S1p}$, $C_{I1p}$, $C_{S1n}$, and $C_{I1n}$ is within a normal operating range.

In FIG. 20, the waveform generator may comprise plurality of current sources. Current sources 210 and 220 charge the capacitors generating two segments of a ramp waveform on the true output $v_{outp}$. Current sources 230 and 240 charge the capacitors generating two segments of a ramp waveform on the complementary output $v_{outn}$.

At the start of $\phi_2$, the outputs $v_{outp}$ and $v_{outn}$ are briefly shorted to known voltages $V_{NEG}$ and $V_{POS}$, respectively, the values of which are chosen to ensure the voltage $v_{1p}-v_{1n}$ crosses zero with signals in the normal operating range.

During the first segment, the current sources 210 and 230 are directed to the outputs $v_{outp}$ and $v_{outn}$, respectively, while during the second segment, the current source 220 and 240 are directed to the outputs generating two different slopes of ramp. This is accomplished by throwing switches $S_{16p}$, $S_{17p}$, $S_{16n}$, and $S_{17n}$ appropriately controlled by the zero-crossing detector 300.

Figure 21:
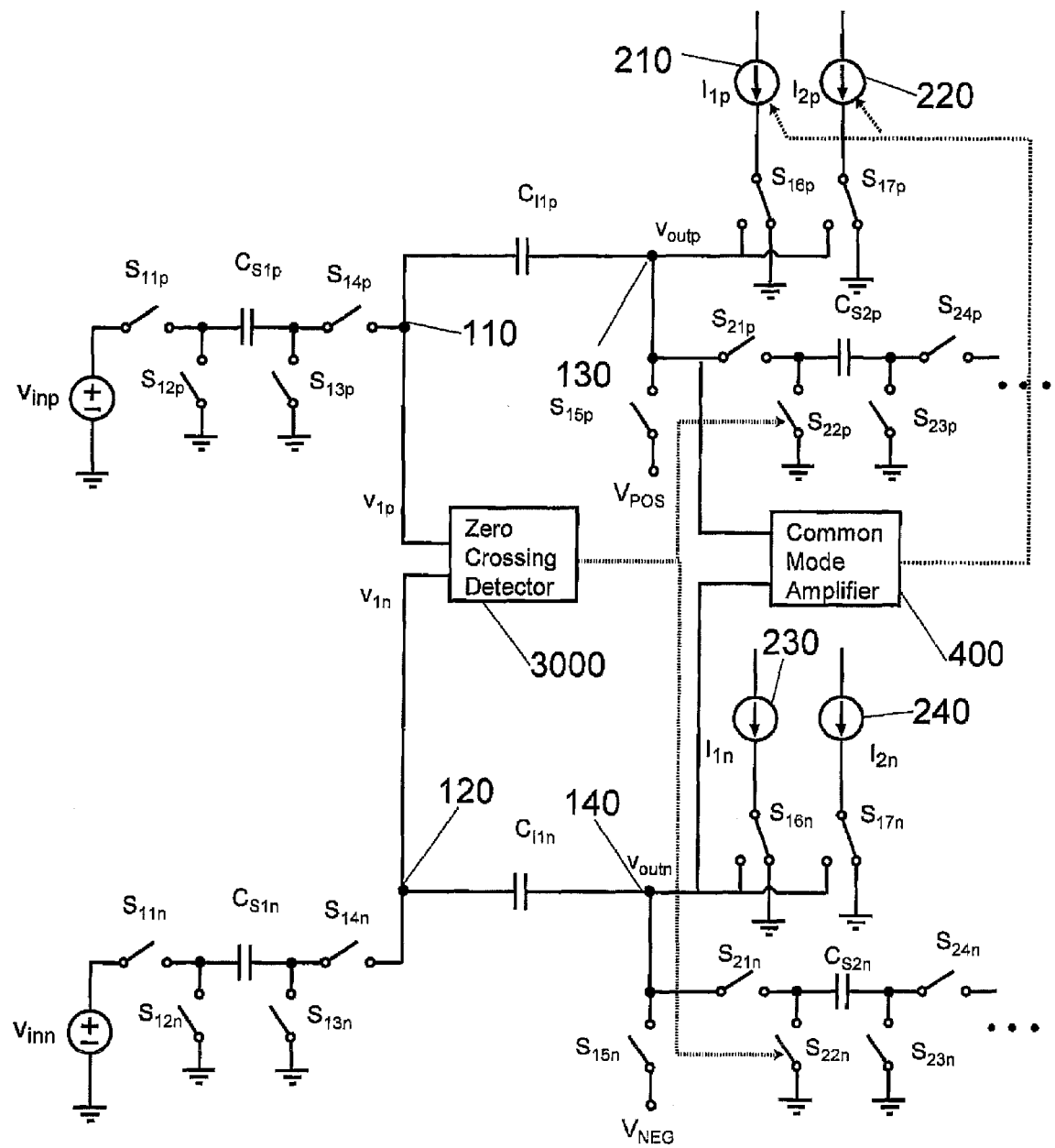
FIG. 21 illustrates another non-inverting integrator with differential signal paths according to the concepts of the present invention.

FIG. 21 illustrates another example of a non-inverting integrator with half-clock delay shown. In FIG. 21, there are two signal paths, the true path and the complementary path. The true signal path comprises capacitors ($C_{S1p}$, $C_{I1p}$, and $C_{S2p}$) and switches ($S_{11p}$, $S_{12p}$, $S_{13p}$, $S_{14p}$, $S_{21p}$, $S_{22p}$, $S_{23p}$, and $S_{24p}$). The complementary signal path comprises capacitors ($C_{S1n}$, $C_{I1n}$, and $C_{S2n}$) and switches ($S_{11n}$, $S_{12n}$, $S_{13n}$, $S_{14n}$, $S_{21n}$, $S_{22n}$, $S_{23n}$, and $S_{24n}$). A clock phase $\phi_1$ is applied to switches $S_{11p}$, $S_{13p}$, $S_{22p}$, $S_{24p}$, $S_{11n}$, $S_{13n}$, $S_{22n}$, and $S_{24n}$, and another clock phase $\phi_2$ is applied to switches $S_{12p}$, $S_{14p}$, $S_{21p}$, $S_{12n}$, $S_{14n}$, and $S_{21n}$. A zero crossing detector 300 is used to detect the point of time at which Node 110 and Node 120 voltages cross each other. The sampling switches $S_{23p}$ and $S_{23n}$ are controlled by the output of the zero crossing detector 300. The output of the zero crossing detector 300 is used to determine the time point to take the samples of the output voltages $v_{outp}$ and $v_{outn}$.

FIG. 21 further illustrates a common-mode feedback circuit 400. The common-mode feedback circuit is similar as those in conventional fully-differential operational amplifiers. The common-mode amplifier 400 amplifies the difference between the output common-mode voltage ($v_{outp}$+$v_{outn}$)/2 and the desired output common-mode voltage. The output of the common-mode amplifier 400 provides negative feedback to controls the current sources 210 and 220 to keep the output common-mode voltage constant.

Alternatively, the output of the common-mode amplifier 400 may control the current sources 230 and 240. The common-mode feedback can be engaged during all or any of the segments. It is preferred that the common-mode feedback be engaged during the first segment only while keeping current source 220 constant and matched to current source 240.

Figure 22:
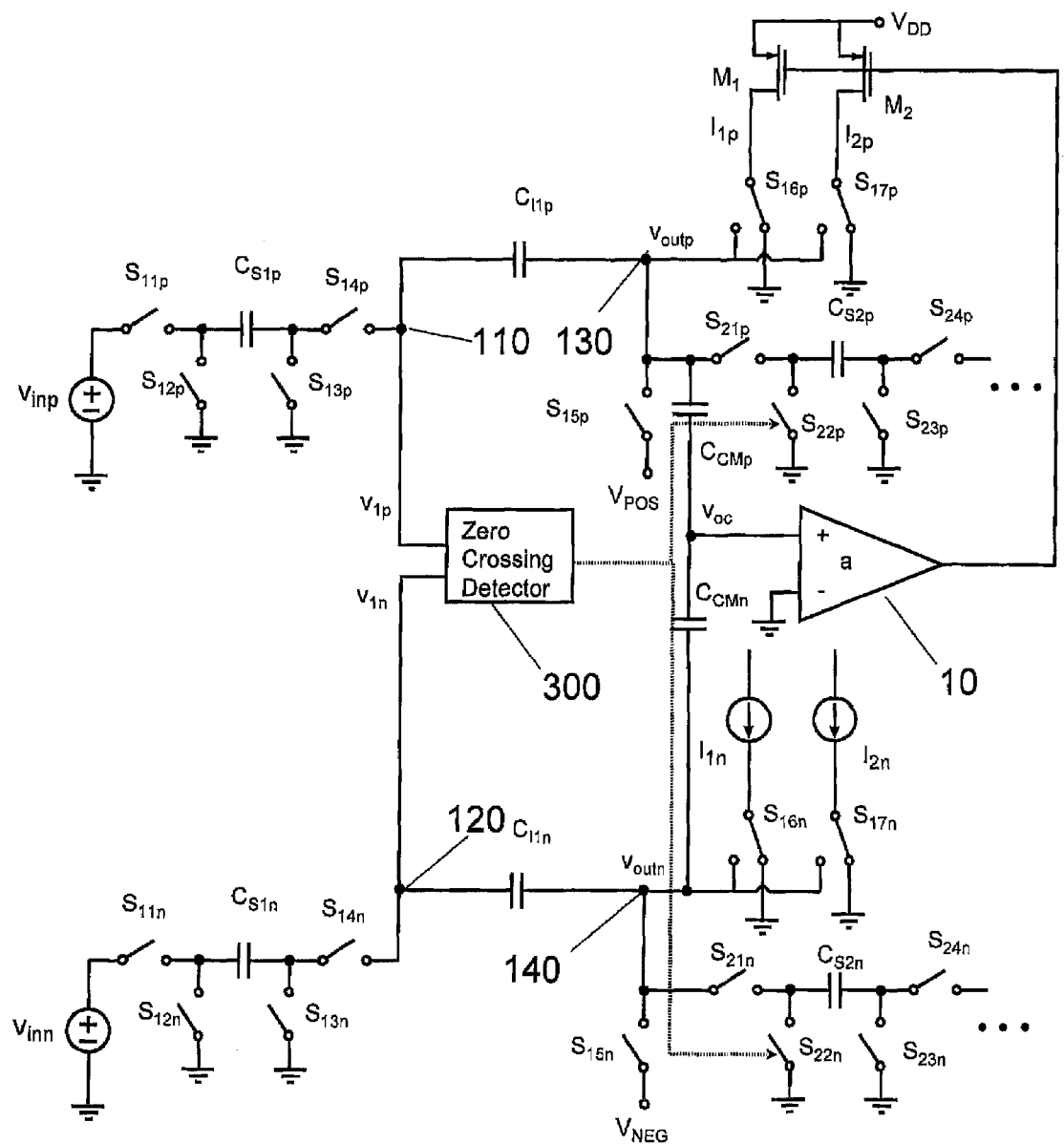
FIG. 22 illustrates a timing diagram for the non-inverting integrator of FIG. 21.

FIG. 22 illustrates another example of a non-inverting integrator with half-clock delay shown. In FIG. 22, there are two signal paths, the true path and the complementary path. The true signal path comprises capacitors ($C_{S1p}$, $C_{I1p}$, and $C_{S2p}$) and switches ($S_{11p}$, $S_{12p}$, $S_{13p}$, $S_{14p}$, $S_{21p}$, $S_{22p}$, $S_{23p}$, and $S_{24p}$). The complementary signal path comprises capacitors ($C_{S1n}$, $C_{I1n}$, and $C_{S2n}$) and switches ($S_{11n}$, $S_{12n}$, $S_{13n}$, $S_{14n}$, $S_{21n}$, $S_{22n}$, $S_{23n}$, and $S_{24n}$). A clock phase $\phi_1$ is applied to switches $S_{11p}$, $S_{13p}$, $S_{22p}$, $S_{24p}$, $S_{11n}$, $S_{13n}$, $S_{22n}$, and $S_{24n}$, and another clock phase $\phi_2$ is applied to switches $S_{12p}$, $S_{14p}$, $S_{21p}$, $S_{21n}$, $S_{14n}$, and $S_{21n}$. A zero crossing detector 300 is used to detect the point of time at which Node 110 and Node 120 voltages cross each other. The sampling switches $S_{23p}$ and $S_{23n}$ are controlled by the output of the zero crossing detector 300. The output of the zero crossing detector 300 is used to determine the time point to take the samples of the output voltages $v_{outp}$ and $v_{outn}$.

In FIG. 22, capacitors $C_{CMp}$ and $C_{CMn}$ produce the common-mode voltage $v_{oc}$ of $v_{outp}$ and $v_{outn}$ at the input of the common mode amplifier 10. MOS transistors $M_1$ and $M_2$ function as current sources to produce currents $I_{1p}$ and $I_{2p}$, respectively. The output of the common-mode amplifier 10 controls the gates of the transistors $M_1$ and $M_2$. The resulting negative feedback forces the common-mode output voltage $v_{oc}$ to the desired common-mode voltage.

Alternatively, the output of the common-mode amplifier 10 may control the current sources which produce currents $I_{1n}$ and $I_{2n}$, respectively. The common-mode feedback can be engaged during all or any of the segments. It is preferred that the common-mode feedback be engaged during the first segment only while keeping current $I_{2p}$ constant and matched to current $I_{2n}$.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A differential switched-capacitor circuit, comprising:
   a level-crossing detector to generate a level-crossing detection signal when a difference between first and second input signals crosses a predetermined level;
   a plurality of capacitors, operatively coupled to said level-crossing detector;
   a sampling switch, operatively coupled to a first output of said level-crossing detector; and
   a waveform generator, operatively coupled to said plurality of capacitors and to an input of said level-crossing detector, to produce a predetermined waveform to be applied to the input of said level-crossing detector in response to a second output signal of said level-crossing detector.

2. The differential switched-capacitor circuit as claimed in claim 1, wherein said level-crossing detector is a zero-crossing detector.

3. The differential switched-capacitor circuit as claimed in claim 1, wherein said waveform generator produces a plurality of predetermined waveforms.

4. The differential switched-capacitor circuit as claimed in claim 3, wherein said waveform generator provides said one of said plurality of predetermined waveforms to compensate for a voltage error generated by a finite delay associated with said level-crossing detector.

5. The differential switched-capacitor circuit as claimed in claim 1, wherein said predetermined waveform is a ramp waveform.

6. A differential switched-capacitor circuit, comprising:
- a first level-crossing detector to generate a level-crossing detection signal when a difference between first and second input signals crosses a first predetermined level;
- a second level-crossing detector to generate a second level-crossing detection signal when a difference between said first and second input signals crosses a second predetermined level;
- a plurality of capacitors, operatively coupled to said first and second level-crossing detectors;
- a sampling switch, operatively coupled to a first output of said second level-crossing detector; and
- a waveform generator, operatively coupled to said plurality of capacitors and to an input of said first and second level-crossing detectors, to produce a predetermined waveform to be applied to the input of said first and second level-crossing detectors in response to a second output signal of said first level-crossing detector.

7. The differential switched-capacitor circuit as claimed in claim 6, wherein said first and second level-crossing detectors are zero-crossing detectors.

8. The differential switched-capacitor circuit as claimed in claim 6, wherein said waveform generator produces a plurality of predetermined waveforms.

9. The differential switched-capacitor circuit as claimed in claim 8, wherein said waveform generator provides said one of said plurality of predetermined waveforms to compensate for a voltage error generated by a finite delay associated with said first and second level-crossing detectors.

10. The differential switched-capacitor circuit as claimed in claim 6, wherein said predetermined waveform is a ramp waveform.

11. A differential switched capacitor circuit, comprising:
- a first switched capacitance network having an input terminal to receive a circuit input voltage;
- a level-crossing detector, having an output terminal and an input terminal, to generate a level-crossing detection signal when a difference between first and second input signals crosses a predetermined level;
- a second switched capacitance network operatively coupled to a first output of said level-crossing detector; and
- a waveform generator, operatively coupled to said second switched capacitance network and to an input of said level-crossing detector, to produce a predetermined waveform to be applied to the input of said level-crossing detector in response to a second output signal of said level-crossing detector.

12. The differential switched-capacitor circuit as claimed in claim 11, wherein said level-crossing detector is a zero-crossing detector.

13. The differential switched-capacitor circuit as claimed in claim 11, wherein said waveform generator produces a plurality of predetermined waveforms.

14. The differential switched-capacitor circuit as claimed in claim 13, wherein said waveform generator provides said one of said plurality of predetermined waveforms to compensate for a voltage error generated by a finite delay associated with said level-crossing detector.

15. The differential switched-capacitor circuit as claimed in claim 11, wherein said predetermined waveform is a ramp waveform.

* * * * *